US012772673B2

(12) United States Patent
Kim et al.

(10) Patent No.: US 12,772,673 B2
(45) Date of Patent: Oct. 20, 2026

(54) DISPLAY DEVICE

(71) Applicant: Samsung Display Co., LTD., Yongin-si (KR)

(72) Inventors: Youngji Kim, Hwaseong-si (KR); Dongjo Kim, Suwon-si (KR); Seonggeun Won, Hwaseong-si (KR); Soyoung Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 659 days.

(21) Appl. No.: 18/311,763

(22) Filed: May 3, 2023

(65) Prior Publication Data

US 2024/0040860 A1 Feb. 1, 2024

(30) Foreign Application Priority Data

Jul. 29, 2022 (KR) ........................ 10-2022-0094348

(51) Int. Cl.
*H10K 59/124* (2023.01)
*H10K 59/80* (2023.01)

(52) U.S. Cl.
CPC ......... *H10K 59/124* (2023.02); *H10K 59/873* (2023.02)

(58) Field of Classification Search
CPC ..... H10K 59/12; H10K 59/124; H10K 59/873
See application file for complete search history.

(56) References Cited

U.S. PATENT DOCUMENTS 11,171,192 B2 11/2021 Jeon et al.
2020/0067017 A1* 2/2020 Seo ........................ H10K 77/10
2020/0106046 A1* 4/2020 Kim ..................... H10K 59/121
2020/0161582 A1* 5/2020 Choi .................... H10K 59/121
2020/0194714 A1* 6/2020 Won ................... H10K 59/8722
2020/0343481 A1* 10/2020 Lee ........................ G06F 1/1686
2021/0234122 A1 7/2021 Choi et al.
2021/0336209 A1 10/2021 Dong et al.
2021/0367196 A1 11/2021 Kanaya
2022/0077425 A1 3/2022 Lee et al.

FOREIGN PATENT DOCUMENTS

KR 10-2017-0095444 A 8/2017
KR 10-2020-0030163 A 3/2020
KR 10-2022-0033611 A 3/2022

OTHER PUBLICATIONS

Korean Office Action, with English translation, dated Feb. 6, 2026, issued in corresponding Korean Patent Application No. 10-2022-0094348 (35 pages).

* cited by examiner

*Primary Examiner* — Shaun M Campbell
(74) *Attorney, Agent, or Firm* — Womble Bond Dickinson (US) LLP

(57) ABSTRACT

A display device includes: a substrate defining a first through-hole of a first hole region; and a panel layer on the substrate, and defining a second through-hole that surrounds the first hole region in a plan view, the panel layer including: a base layer defining a groove surrounding a second hole region in a plan view, the second hole region overlapping with the second through-hole; an organic light emitting layer including a cut part overlapping with the groove, and having an edge defining a portion of the second through-hole; and an inorganic encapsulation layer on the organic light emitting layer, and covering the groove, the inorganic encapsulation layer having an edge defining a portion of the second through-hole.

11 Claims, 28 Drawing Sheets

MP_P1:M1_P1,M2_P1,M3_P1,M4_P1,M5_P1,M6_P1
MP_P2:M1_P2,M2_P2,M3_P2,M4_P2,M5_P2,M6_P2

DISPLAY DEVICE

CROSS-REFERENCE TO RELATED APPLICATION

This application claims priority to and the benefit of Korean Patent Application No. 10-2022-0094348, filed in the Korean Intellectual Property Office (KIPO) on Jul. 29, 2022, the entire disclosure of which is incorporated by reference herein.

BACKGROUND

1. Field

Aspects of embodiments of the present disclosure relate to a display device.

2. Description of the Related Art

A display device may be provided with a display region in which an image is displayed. Recently, a display device that is further provided with a hole region, which is a region in which an electronic device is disposed and is configured to detect light received from the outside, within the display region has been spotlighted. For example, a camera may be disposed in the hole region. In this case, the hole region may be surrounded by the display region, so that a user of the display device may simultaneously capture an image with the camera and view the image displayed in the display region.

The above information disclosed in this Background section is for enhancement of understanding of the background of the present disclosure, and therefore, it may contain information that does not constitute prior art.

SUMMARY

In order to provide the hole region, a through-hole may be formed in a substrate and a panel layer included in the display device. In this case, the panel layer may be damaged during a process of forming the through-hole, so that display defects may occur at a periphery of the through-hole.

In addition, during the process of forming the through-hole, or after the formation of the through-hole, moisture and foreign substances may permeate through the through-hole, so that display defects may occur at a periphery of the through-hole.

One or more embodiments of the present disclosure may be directed to a display device capable of preventing or reducing display defects.

However, the aspects and features of the present disclosure are not limited to those described above. Additional aspects and features will be set forth, in part, in the description that follows, and in part, may be apparent from the description, or may be learned by practicing one or more of the presented embodiments of the present disclosure.

According to one or more embodiments of the present disclosure, a display device includes: a substrate defining a first through-hole of a first hole region; and a panel layer on the substrate, and defining a second through-hole that surrounds the first hole region in a plan view, the panel layer including: a base layer defining a groove surrounding a second hole region in a plan view, the second hole region overlapping with the second through-hole; an organic light emitting layer including a cut part overlapping with the groove, and having an edge defining a portion of the second through-hole; and an inorganic encapsulation layer on the organic light emitting layer, and covering the groove, the inorganic encapsulation layer having an edge defining a portion of the second through-hole.

In an embodiment, the base layer may include: a first inorganic barrier layer on the substrate; an organic base layer on the first inorganic barrier layer, and defining a first opening of a portion of the groove that exposes a portion of a top surface of the first inorganic barrier layer; and a second inorganic barrier layer on the organic base layer, and defining a second opening overlapping with the first opening to define a portion of the groove.

In an embodiment, a width of the second opening may be less than a width of the first opening in a region adjacent to the second opening in a cross-sectional view.

In an embodiment, an edge of the first inorganic barrier layer may define a portion of the second through-hole, and may be aligned with the edge of the inorganic encapsulation layer.

In an embodiment, each of an edge of the organic base layer and an edge of the second inorganic barrier layer may define a portion of the second through-hole, and the edge of the first inorganic barrier layer, the edge of the organic base layer, and the edge of the second inorganic barrier layer may be aligned with each other.

In an embodiment, the edge of the organic light emitting layer and the edge of the inorganic encapsulation layer may be aligned with each other.

In an embodiment, the panel layer may further include a common electrode layer between the inorganic encapsulation layer and the organic light emitting layer, the common electrode layer having an edge defining a portion of the second through-hole.

In an embodiment, the edge of the organic light emitting layer and the edge of the common electrode layer may be aligned with each other.

In an embodiment, the common electrode layer may include a cut part overlapping with the groove.

In an embodiment, the second through-hole may expose a portion of a top surface of the substrate that is adjacent to the first hole region.

In an embodiment, the panel layer may further include a planarization layer on at least a portion of the inorganic encapsulation layer, and having an edge defining a portion of the second through-hole.

In an embodiment, the edge of the planarization layer and the edge of the organic light emitting layer may be aligned with each other.

According to one or more embodiments of the present disclosure, a display device includes: a substrate defining a first through-hole of a first hole region; and a panel layer on the substrate, and defining a second through-hole surrounding the first hole region in a plan view, the panel layer including: an organic light emitting layer defining a groove that surrounds a second hole region in a plan view, and having an edge defining a portion of the second through-hole, the second hole region overlapping with the second through-hole; and an inorganic encapsulation layer on the organic light emitting layer, and covering the groove, the inorganic encapsulation layer having an edge defining a portion of the second through-hole.

In an embodiment, the edge of the organic light emitting layer and the edge of the inorganic encapsulation layer may be aligned with each other.

In an embodiment, the panel layer may further include: an inorganic barrier layer on the substrate; and a gate insulating layer between the inorganic barrier layer and the organic light emitting layer.

In an embodiment, the groove may expose a portion of a top surface of the gate insulating layer.

In an embodiment, each of an edge of the inorganic barrier layer and an edge of the gate insulating layer may define a portion of the second through-hole.

In an embodiment, the edge of the inorganic barrier layer, the edge of the gate insulating layer, and the edge of the inorganic encapsulation layer may be aligned with each other.

In an embodiment, the second through-hole may expose a portion of a top surface of the substrate adjacent to the first hole region.

In an embodiment, the panel layer may further include a common electrode layer between the inorganic encapsulation layer and the organic light emitting layer, and defining the groove together with the organic light emitting layer.

In an embodiment, an edge of the common electrode layer may define a portion of the second through-hole, and the edge of the organic light emitting layer and the edge of the common electrode layer may be aligned with each other.

In an embodiment, the panel layer may further include a planarization layer on at least a portion of the inorganic encapsulation layer, and having an edge defining a portion of the second through-hole.

In an embodiment, the edge of the planarization layer and the edge of the inorganic encapsulation layer may be aligned with each other.

According to one or more embodiments of the present disclosure, a display device includes: a substrate defining a first through-hole of a first hole region; and a panel layer on the substrate, and defining a second through-hole that surrounds the first hole region in a plan view, the panel layer including: a first via insulating layer defining a first opening that surrounds a second hole region in a plan view, the second hole region overlapping with the second through-hole; a pattern layer on the first via insulating layer, and defining a second opening overlapping with the first opening; a second via insulating layer on the pattern layer, and defining a third opening overlapping with the second opening; an organic light emitting layer including a cut part overlapping with a groove defined by the first opening, the second opening, and the third opening, and having an edge defining a portion of the second through-hole; and an inorganic encapsulation layer on the organic light emitting layer, and covering the groove, the inorganic encapsulation layer having an edge defining a portion of the second through-hole.

In an embodiment, a width of the second opening may be less than a width of the first opening in a region adjacent to the second opening in a cross-sectional view.

In an embodiment, the edge of the organic light emitting layer and the edge of the inorganic encapsulation layer may be aligned with each other.

In an embodiment, the panel layer may further include a common electrode layer between the inorganic encapsulation layer and the organic light emitting layer, the common electrode layer including a cut part overlapping with the groove, and having an edge defining a portion of the second through-hole.

In an embodiment, each of an edge of the first via insulating layer and an edge of the second via insulating layer may define a portion of the second through-hole, and the edge of the first via insulating layer, the edge of the second via insulating layer, and the edge of the organic light emitting layer may be aligned with each other.

In an embodiment, the second through-hole may expose a portion of a top surface of the substrate adjacent to the first hole region.

In an embodiment, the panel layer may further include a planarization layer on at least a portion of the inorganic encapsulation layer, and having an edge defining a portion of the second through-hole.

In an embodiment, the edge of the planarization layer and the edge of the inorganic encapsulation layer may be aligned with each other.

According to one or more embodiments of the present disclosure, a display device includes: a substrate defining a first through-hole of a first hole region; and a panel layer on the substrate, and defining a second through-hole surrounding the first hole region in a plan view, the panel layer including: a metal pattern defining a groove surrounding a second hole region in a plan view, the second hole region overlapping with the second through-hole; an organic light emitting layer including a cut part overlapping with the groove, and having an edge defining a portion of the second through-hole; and an inorganic encapsulation layer on the organic light emitting layer, and covering the groove, the inorganic encapsulation layer having an edge defining a portion of the second through-hole.

In an embodiment, the edge of the organic light emitting layer and the edge of the inorganic encapsulation layer may be aligned with each other.

In an embodiment, the metal pattern may include: a lower pattern part defining a first opening defining a portion of the groove; and an upper pattern part on the lower pattern part, and defining a second opening overlapping with the first opening and defining a portion of the groove.

In an embodiment, a width of the second opening may be less than a width of the first opening in a region adjacent to the second opening in a cross-sectional view.

In an embodiment, the panel layer may further include: an inorganic barrier layer on the substrate, and having an edge defining a portion of the second through-hole; and a gate insulating layer on the inorganic barrier layer and having a top surface partially exposed by the first opening, the gate insulating layer having an edge defining a portion of the second through-hole.

In an embodiment, the edge of the inorganic barrier layer, the edge of the gate insulating layer, and the edge of the inorganic encapsulation layer may be aligned with each other.

In an embodiment, the panel layer may further include a common electrode layer between the organic light emitting layer and the inorganic encapsulation layer, the common electrode layer including a cut part overlapping with the groove, and having an edge defining a portion of the second through-hole.

In an embodiment, the edge of the organic light emitting layer and the edge of the common electrode layer may be aligned with each other.

In an embodiment, the second through-hole may expose a portion of a top surface of the substrate adjacent to the first hole region.

In an embodiment, the panel layer may further include a planarization layer on at least a portion of the inorganic encapsulation layer, and having an edge defining a portion of the second through-hole.

In an embodiment, the edge of the planarization layer and the edge of the inorganic encapsulation layer may be aligned with each other.

According to one or more embodiments of the present disclosure, the display device may include a substrate defining a first through-hole, and a panel layer defining a second through-hole that surrounds a first hole region overlapping with the first through-hole in a plan view. The panel layer may define a groove that surrounds a second hole region overlapping with the second through-hole in a plan view.

According to one or more embodiments of the present disclosure, because the second through-hole surrounds the first hole region, a sufficient margin may be ensured between the panel layer and the devices (e.g., a polishing device or a laser device) used to form the first through-hole in a process of forming the first through-hole after the second through-hole is formed. Accordingly, the panel layer may be prevented or substantially prevented from being damaged by the devices.

According to one or more embodiments of the present disclosure, because the groove surrounds the second hole region, during a period from the formation of the second through-hole to the formation of the first through-hole, or after the formation of the first through-hole, moisture and foreign substances permeating through the first through-hole and the second through-hole may be blocked by the groove. Accordingly, the panel layer may be prevented or substantially prevented from being damaged by the moisture and the foreign substances.

However, the aspects and features of the present disclosure are not limited to those above, and may be variously expanded without departing from the spirit and scope of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
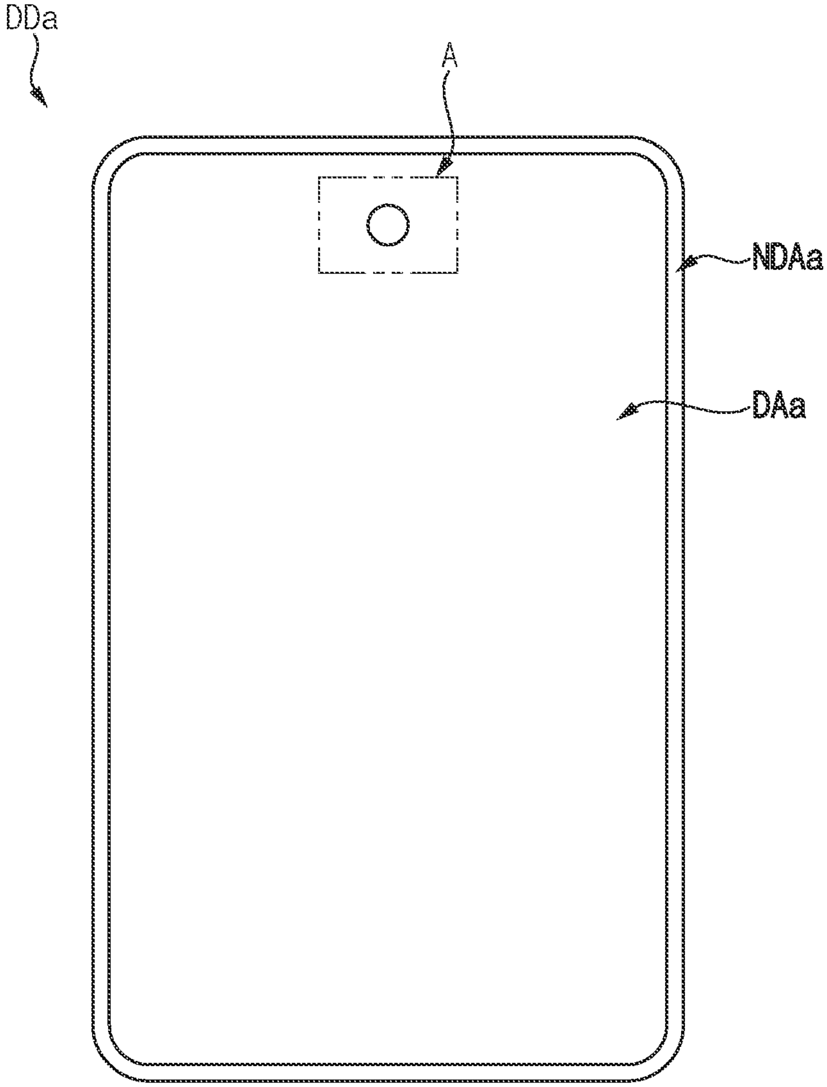
FIG. 1 is a plan view illustrating a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to an embodiment of the present disclosure.

Referring to FIG. 1, a display device DDa may include a display region DAa, and a peripheral region NDAa surrounding (e.g., around a periphery of) the display region DAa.

The display region DAa may be a region in which an image is displayed. A plurality of pixels configured to emit light may be disposed at (e.g., in or on) the display region DAa. The peripheral region NDAa may be located on at least one side of the display region DAa. For example, as shown in FIG. 1, the peripheral region NDAa may surround (e.g., around a periphery of) the display region DAa. A plurality of drivers configured to provide (e.g., transmit) driving signals to the pixels may be disposed at (e.g., in or on) the peripheral region NDAa.

A hole region, which is a region where an image is not displayed, and in which an electronic device configured to detect light received from the outside is disposed, may be defined in at least a portion (e.g., a region A) of the display region DAa. For example, a camera may be disposed in the hole region. In this case, a user of the display device DDa may concurrently (e.g., simultaneously or substantially simultaneously) capture an image with the camera, and view the image displayed in the display region DAa.

Figure 2:
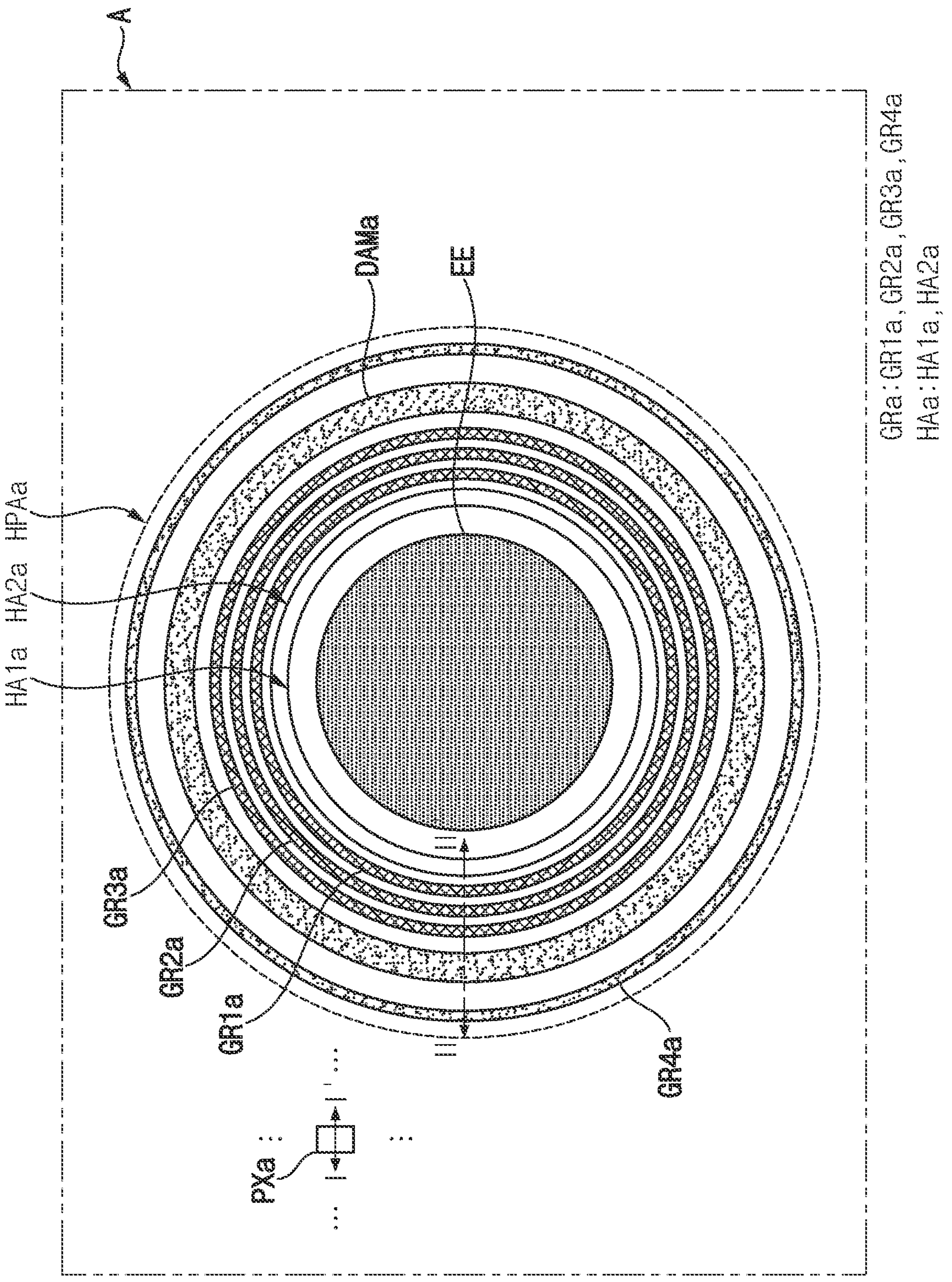
FIGS. 2-5 are views illustrating a hole region of the display device illustrated in FIG. 1, according to some embodiments.
Figure 3:
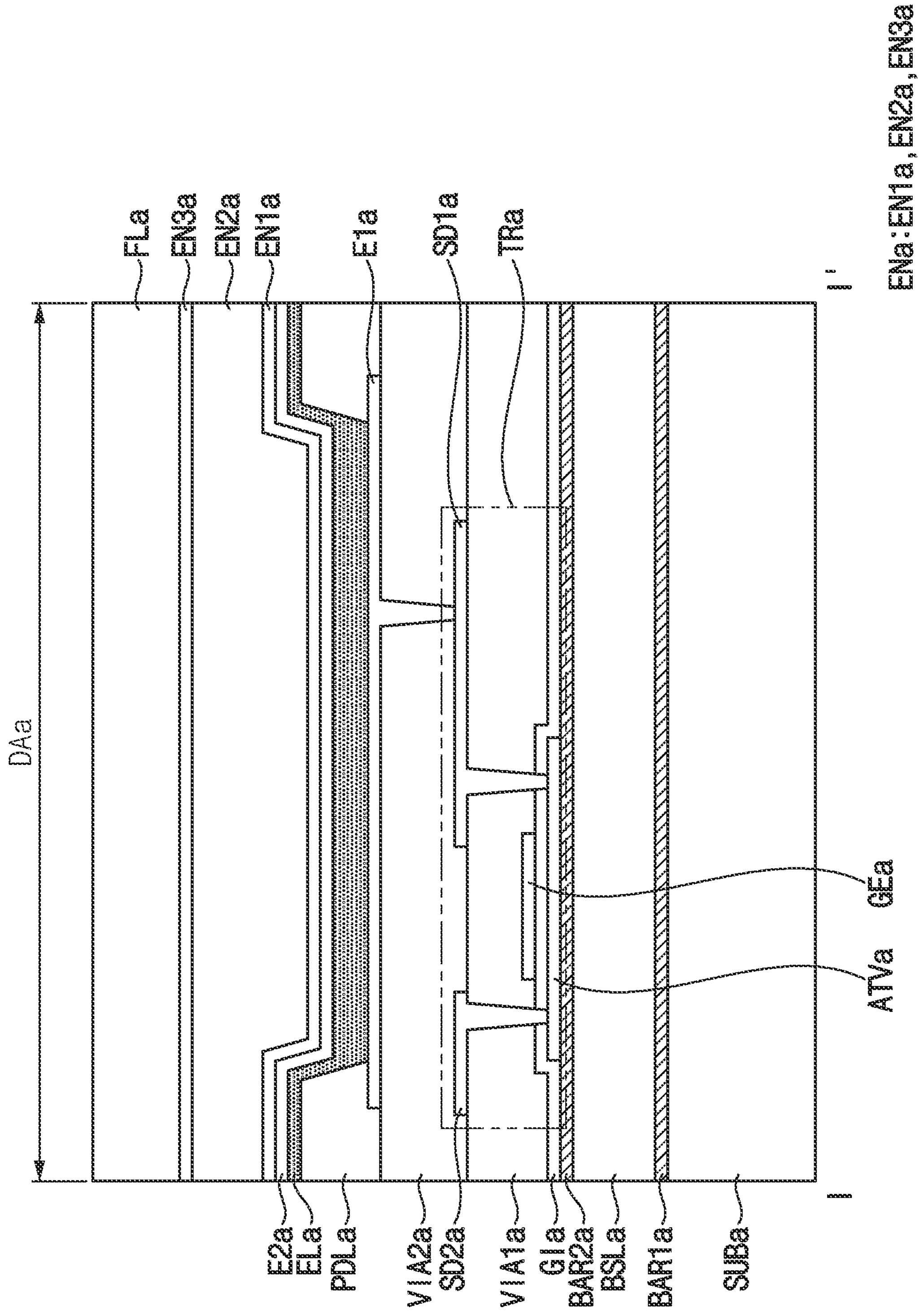
Figure 4:
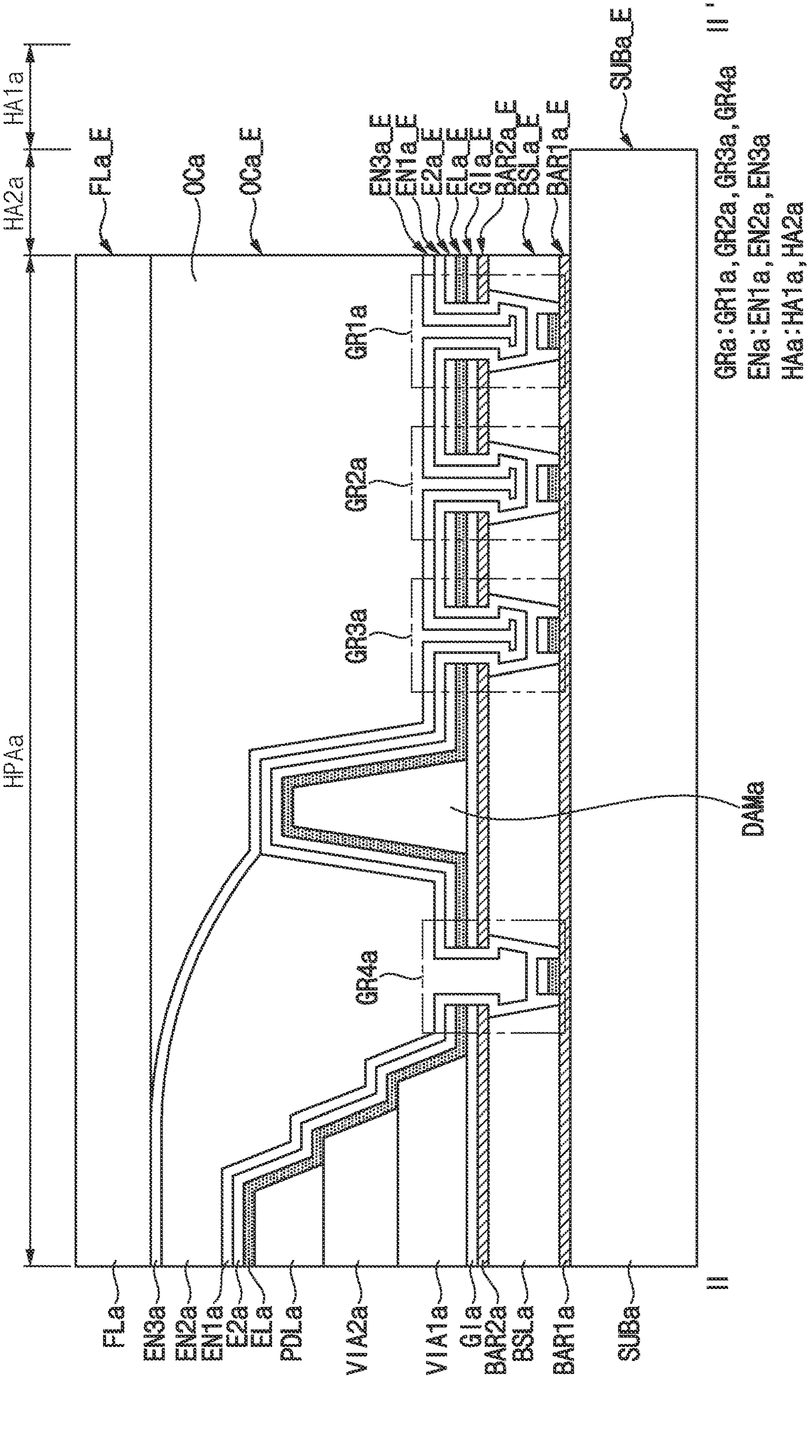
Figure 5:
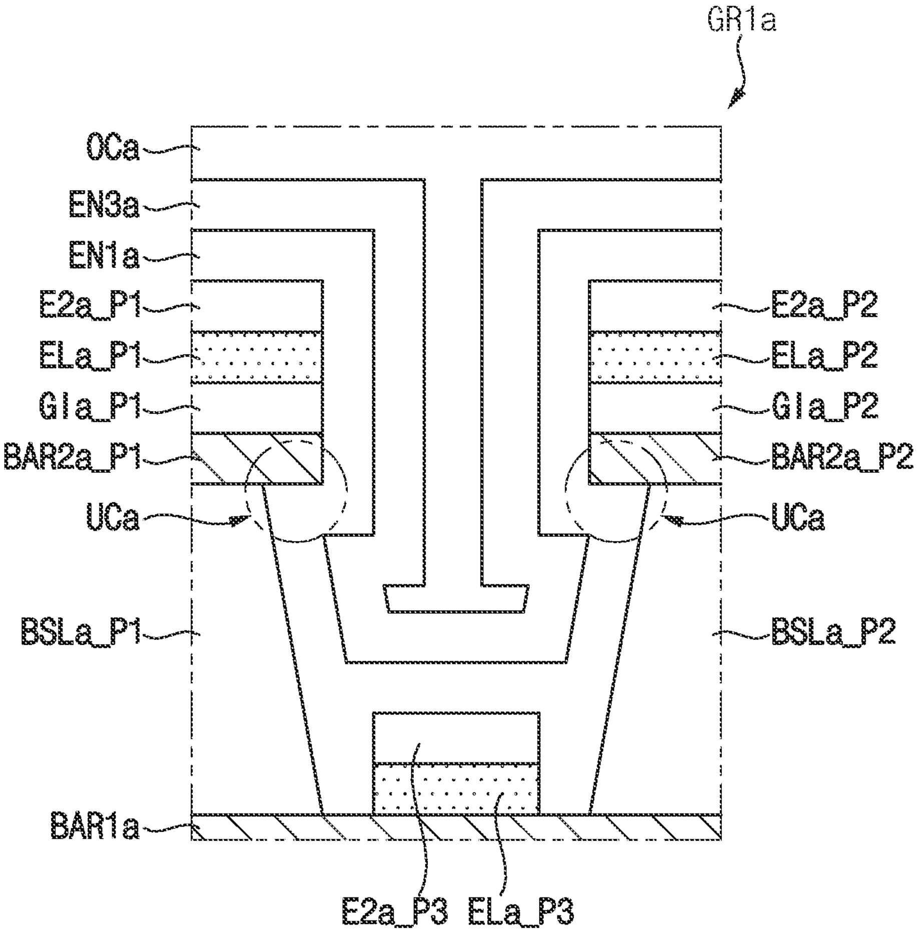

FIGS. 2 through 5 are views illustrating a hole region of the display device illustrated in FIG. 1, according to some embodiments. FIG. 2 is an enlarged plan view of the region A of FIG. 1. FIG. 3 is a sectional view taken along the line I-I' of FIG. 2. FIG. 4 is a sectional view taken along the line II-II' of FIG. 2. FIG. 5 is a sectional view illustrating a first groove of FIG. 4.

Referring to FIGS. 1 and 2, a hole region HAa may be defined in the portion (e.g., the region A) of the display region DAa. The hole region HAa may include a first hole region HA1*a*, and a second hole region HA2*a* surrounding (e.g., around a periphery of) the first hole region HA1*a*. In addition, a hole periphery region HPAa surrounding (e.g., around a periphery of) the hole region HAa may be defined between the display region DAa and the hole region HAa.

Each of the first hole region HA1*a* and the second hole region HA2*a* may be a region in which a through-hole formed through (e.g., penetrating) various suitable elements included in the display device DDa is defined. An electronic device EE may be disposed inside the through-hole. According to one or more embodiments of the present disclosure, as shown in FIG. 2, when viewed in a plan view, the second hole region HA2*a* may surround (e.g., around a periphery of) the first hole region HA1*a*. In other words, an edge of the second hole region HA2*a* may be spaced apart from an edge of the first hole region HA1*a*, while surrounding (e.g., around a periphery of) the edge of the first hole region HA1*a*. The first hole region HA1*a* and the second hole region HA2*a* will be described in more detail below with reference to FIG. 4.

The hole periphery region HPAa may surround (e.g., around a periphery of) the first hole region HA1*a* and the second hole region HA2*a* when viewed in a plan view. At least one groove and at least one dam may be formed in the hole periphery region HPAa. For example, a first groove GR1*a* surrounding (e.g., around a periphery of) the second hole region HA2*a*, a second groove GR2*a* surrounding (e.g., around a periphery of) the first groove GR1*a*, a third groove GR3*a* surrounding (e.g., around a periphery of) the second groove GR2*a*, a dam DAMa surrounding (e.g., around a periphery of) the third groove GR3*a*, and a fourth groove GR4*a* surrounding (e.g., around a periphery of) the dam DAMa may be formed in the hole periphery region HPAa. The first to fourth grooves GR1*a*, GR2*a*, GR3*a*, and GR4*a* may serve to block moisture and foreign substances that may permeate into the display region DAa from the first hole region HA1*a* and the second hole region HA2*a*. In addition, the dam DAMa may serve to prevent or substantially prevent an organic encapsulation layer disposed at (e.g., in or on) the display region DAa from overflowing into the first hole region HA1*a* and the second hole region HA2*a*. The groove and the dam formed in the hole periphery region HPAa will be described in more detail below with reference to FIG. 4.

A pixel PXa may be disposed at (e.g., in or on) the display region DAa outside the hole periphery region HPAa. The pixel PXa may emit light, and a plurality of pixels PXa may be provided at (e.g., in or on) the display region DAa.

Accordingly, an image may be displayed in the display region DAa by combining the light emitted from the pixels.

Hereinafter, the pixel PXa of the display device DDa will be described in more detail with reference to FIG. 3.

Referring to FIG. 3, the display device DDa may include a substrate SUBa, a first inorganic barrier layer BAR1 a, an organic base layer BSLa, a second inorganic barrier layer BAR2*a*, an active layer ATVa, a gate insulating layer Gla, a gate electrode GEa, a first via insulating layer VIA1*a*, a first source-drain electrode SD1*a*, a second source-drain electrode SD2*a*, a second via insulating layer VIA2*a*, a pixel electrode Ela, a pixel defining layer PDLa, an organic light emitting layer ELa, a common electrode layer E2*a*, an encapsulation layer ENa, and a functional layer Fla. These elements may define the pixel PXa disposed at (e.g., in or on) the display region DAa.

The substrate SUBa may include glass, quartz, plastic, and/or the like. According to an embodiment, the substrate SUBa may have a flexible property, so that the substrate SUBa may be repeatedly folded or unfolded.

The first inorganic barrier layer BAR1 a may be disposed on the substrate SUBa. The first inorganic barrier layer BAR1 a may block diffusion of foreign substances that may be present on the substrate SUBa. The first inorganic barrier layer BAR1 a may include an inorganic insulating material. For example, the first inorganic barrier layer BAR1 a may include silicon oxide, silicon nitride, silicon oxynitride, and/or the like.

The organic base layer BSLa may be disposed on the first inorganic barrier layer BAR1 a. The organic base layer BSLa may include an organic insulating material. For example, the organic base layer BSLa may include polyimide, polyethylene naphthalate, polyethylene terephthalate, polyarylate, polycarbonate, polyetherimide, polyethersulfone, and/or the like. Because the organic base layer BSLa includes the organic insulating material, a top surface of the organic base layer BSLa may be flat or substantially flat at (e.g., in or on) the display region DAa. Accordingly, the organic base layer BSLa may compensate for a curvature or a step of a top surface of the substrate SUBa, so that the second inorganic barrier layer BAR2*a* described in more detail below may be formed on a flat or substantially flat surface.

The second inorganic barrier layer BAR2*a* may be disposed on the organic base layer BSLa. The second inorganic barrier layer BAR2*a* may serve to block diffusion of foreign substances that may be present on the organic base layer BSLa. The second inorganic barrier layer BAR2*a* may include an inorganic insulating material. For example, the second inorganic barrier layer BAR2*a* may include silicon oxide, silicon nitride, silicon oxynitride, and/or the like.

The first inorganic barrier layer BAR1 a, the organic base layer BSLa, and the second inorganic barrier layer BAR2*a* may serve as a base substrate on which the active layer ATVa described in more detail below and the like are disposed. In this case, the first inorganic barrier layer BAR1 a, the organic base layer BSLa, and the second inorganic barrier layer BAR2*a* may be referred to as a base layer.

The active layer ATVa may be disposed on the second inorganic barrier layer BAR2*a*. The active layer ATVa may include a semiconductor material. For example, the active layer ATVa may include a silicon semiconductor material, an oxide semiconductor material, and/or the like.

The gate insulating layer Gla may be disposed on the second inorganic barrier layer BAR2*a*, and may cover the active layer ATVa. The gate insulating layer Gla may include an inorganic insulating material. For example, the gate insulating layer Gla may include silicon oxide, silicon nitride, silicon oxynitride, and/or the like.

The gate electrode GEa may be disposed on the gate insulating layer Gla. The gate electrode GEa may include a conductive material. In this case, at least a portion of the gate electrode GEa may overlap with at least a portion of the active layer ATVa. Accordingly, the gate electrode GEa may adjust an electrical conductivity of the active layer ATVa based on a signal applied to the gate electrode GEa.

The first via insulating layer VIA1*a* may be disposed on the gate insulating layer Gla, and may cover the gate electrode GEa. The first via insulating layer VIA1*a* may include an organic insulating material. Because the first via insulating layer VIA1*a* includes the organic insulating material, a top surface of the first via insulating layer VIA1*a* may be flat or substantially flat at (e.g., in or on) the display region DAa.

The first source-drain electrode SD1*a* and the second source-drain electrode SD2*a* may be disposed on the first via insulating layer VIA1*a*. Each of the first source-drain electrode SD1 a and the second source-drain electrode SD2*a* may be electrically connected to at least a portion of the active layer ATVa. For example, each of the first source-drain electrode Sal a and the second source-drain electrode SD2*a* may extend along a corresponding through-hole formed through (e.g., penetrating) the first via insulating layer VIA1*a* and the gate insulating layer Gia, to make contact with a corresponding portion of the active layer ATVa. Each of the first source-drain electrode SD1 a and the second source-drain electrode SD2*a* may include a conductive material.

The active layer ATVa, the gate electrode GEa, the first source-drain electrode SD1*a*, and the second source-drain electrode SD2*a* may define a transistor TRa. The transistor TRa may adjust the electrical conductivity of the active layer ATVa through the gate electrode Gea to output an electrical signal, which is input to the second source-drain electrode SD2*a*, to the first source-drain electrode SD1*a*.

The second via insulating layer VIA2*a* may be disposed on the first via insulating layer VIA1*a*, and may cover the first source-drain electrode SD1*a* and the second source-drain electrode SD2*a*. The second via insulating layer VIA2*a* may include an organic insulating material. Because the second via insulating layer VIA2*a* includes the organic insulating material, a top surface of the second via insulating layer VIA2*a* may be flat or substantially flat at (e.g., in or on) the display region DAa.

The pixel electrode E1*a* may be disposed on the second via insulating layer VIA2*a*. The pixel electrode E1*a* may include a conductive material, and may be electrically connected to the first source-drain electrode SD1*a*. For example, the pixel electrode Ela may extend along a through-hole formed through (e.g., penetrating) the second via insulating layer VIA2*a*, to make contact with a portion of the first source-drain electrode SD1*a*. Accordingly, an electrical signal output from the first source-drain electrode SD1 a may be provided to the pixel electrode E1*a*. According to an embodiment, the pixel electrode E1*a* may be referred to as an anode electrode.

The pixel defining layer PDLa may be disposed on the second via insulating layer VIA2*a*. The pixel defining layer PDLa may define a pixel opening exposing at least a portion of the pixel electrode E1*a*. The pixel defining layer PDLa may include an organic insulating material.

The organic light emitting layer ELa may be disposed on the pixel electrode E1*a* within the pixel opening. In addition, the organic light emitting layer ELa may extend from an inside of the pixel opening, so that the organic light emitting layer ELa may also be disposed on the pixel defining layer PDLa. The organic light emitting layer ELa may include an organic light emitting material. According to an embodiment, the organic light emitting layer ELa may further include at least one of an electron injection layer, an electron transport layer, a hole transport layer, or a hole injection layer.

The common electrode layer E2*a* may be disposed on the organic light emitting layer ELa. The common electrode layer E2*a* may include a transparent conductive material. According to an embodiment, the common electrode layer E2*a* may be referred to as a cathode electrode.

The encapsulation layer ENa may be disposed on the common electrode layer E2*a*, and may cover the common electrode layer E2*a*. Accordingly, the encapsulation layer ENa may protect the common electrode layer E2*a*, the organic light emitting layer ELa, the pixel electrode E1*a*, and the transistor TRa from moisture and foreign substances.

The encapsulation layer ENa may include a first inorganic encapsulation layer EN1*a*, an organic encapsulation layer EN2*a*, and a second inorganic encapsulation layer EN3*a*. The first inorganic encapsulation layer EN1*a* may be disposed on the common electrode layer E2*a*, and may include an inorganic insulating material. The organic encapsulation layer EN2*a* may be disposed on the first inorganic encapsulation layer EN1*a*, and may include an organic insulating material. The second inorganic encapsulation layer EN3*a* may be disposed on the organic encapsulation layer EN2*a*, and may include an inorganic insulating material.

The functional layer FLa may be disposed on the encapsulation layer ENa. The functional layer FLa may include various suitable layers having various suitable functions for improving a convenience of the user of the display device DDa. For example, the functional layer FLa may include at least one of a polarization layer configured to prevent or substantially prevent reflection of external light to improve visibility of an image displayed in the display region DAa, an input detection layer configured to detect an input of the user of the display device DDa, and/or a color filter layer configured to selectively transmit light having a suitable wavelength (e.g., a specific or predetermined wavelength).

Hereinafter, the first hole region HA1*a*, the second hole region HA2*a*, and the hole periphery region HPAa will be described in more detail with reference to FIGS. 4 and 5.

Referring to FIGS. 2, 4, and 5, the substrate SUBa, the first inorganic barrier layer BAR1 a, the organic base layer BSLa, the second inorganic barrier layer BAR2*a*, the gate insulating layer Gla, the first via insulating layer VIA1*a*, the second via insulating layer VIA2*a*, the pixel defining layer PDLa, the organic light emitting layer ELa, the common electrode layer E2*a*, the encapsulation layer ENa, and the functional layer FLa may extend from the display region DAa to at least the hole periphery region HPAa.

The organic base layer BSLa and the second inorganic barrier layer BAR2*a* may define a groove GRa in the hole periphery region HPAa. The groove GRa may include, for example, a first groove GR1*a*, a second groove GR2*a*, a third groove GR3*a*, and a fourth groove GR4*a*. The dam DAMa surrounding (e.g., around a periphery of) the third groove GR3*a* may be disposed between the third groove GR3*a* and the fourth groove GR4*a*.

The first groove GR1*a* may include a first opening and a second opening. The first opening may be defined by the organic base layer BSLa, and may expose a portion of a top surface of the first inorganic barrier layer BAR1 a. The second opening may be defined by the second inorganic barrier layer BAR2*a* to overlap with the first opening. For example, the first opening may be defined as a space between a first portion BSLa_P1 of the organic base layer BSLa and a second portion BSLa_P2 of the organic base layer BSLa, which are disposed on the first inorganic barrier layer BAR1 a while being spaced apart from each other. The second opening may be defined as a space between a first portion BAR2*a*_P1 of the second inorganic barrier layer BAR2*a* and a second portion BAR2*a*_P2 of the second inorganic barrier layer BAR2*a*, which are disposed on the organic base layer BSLa while being spaced apart from each other.

In this case, as shown in FIG. 5, the first opening may have a shape having a width that decreases (e.g., that gradually decreases) in a direction toward the first barrier layer BAR1*a*. In other words, each of the first portion BSLa_P1 of the organic base layer BSLa and the second portion BSLa_P2 of the organic base layer BSLa may have a positively tapered shape with respect to a top surface of the first barrier layer BAR1*a*.

In addition, a width of the second opening may be less than a width of the first opening in a region that is adjacent to the second opening when viewed in a sectional view (e.g., in a cross-sectional view). Accordingly, an undercut region Uca, in which a bottom surface of the first portion BAR2*a*_P1 of the second inorganic barrier layer BAR2*a* is exposed, may be defined in a region that is adjacent to an interface between the first portion BAR2*a*_P1 of the second inorganic barrier layer BAR2*a* and the first portion BSLa_P1 of the organic base layer BSLa. Similarly, an undercut region Uca, in which a bottom surface of the second portion BAR2*a*_P2 of the second inorganic barrier layer BAR2*a* is exposed, may be defined in a region that is adjacent to an interface between the second portion BAR2*a*_P2 of the second inorganic barrier layer BAR2*a* and the second portion BSLa_P2 of the organic base layer BSLa.

In this case, each of the organic light emitting layer ELa and the common electrode layer E2*a* disposed on the second inorganic barrier layer BAR2*a* may be disconnected along a region in which the first groove GR1*a* is defined by a step between the second inorganic barrier layer BAR2*a* and the organic base layer BSLa in the undercut region UCa.

In more detail, a first portion ELa_P1 of the organic light emitting layer ELa and a first portion E2a_P1 of the common electrode layer E2*a* may be sequentially stacked on a first portion Gla_P1 of the gate insulating layer Gla, which is disposed on the first portion BAR2*a*_P1 of the second inorganic barrier layer BAR2*a*. A second portion ELa_P2 of the organic light emitting layer ELa and a second portion E2a_P2 of the common electrode layer E2*a* may be sequentially stacked on a second portion Gla_P2 of the gate insulating layer Gla, which is disposed on the second portion BAR2*a*_P2 of the second inorganic barrier layer BAR2*a*. In addition, a third portion ELa_P3 of the organic light emitting layer ELa and a third portion E2a_P3 of the common electrode layer E2*a* may be sequentially stacked on the first inorganic barrier layer BAR1 a within the first groove GR1*a*.

Each of the third portion ELa_P3 of the organic light emitting layer ELa and the third portion E2a_P3 of the common electrode layer E2*a* may be spaced apart from the first portion ELa_P1 of the organic light emitting layer ELa, the first portion E2a_P1 of the common electrode layer E2*a*, the second portion ELa_P2 of the organic light emitting layer ELa, and the second portion E2a_P2 of the common electrode layer E2*a*. Accordingly, each of the organic light emitting layer ELa and the common electrode layer E2*a* may be disconnected in the region in which the first groove GR1*a* is defined. For example, the first portion ELa_P1 of the organic light emitting layer ELa and the second portion ELa_P2 of the organic light emitting layer ELa may be spaced apart from each other, while being electrically insulated from each other. The first portion E2a_P1 of the common electrode layer E2*a* and the second portion E2a_P2 of the common electrode layer E2*a* may be spaced apart from each other, while being electrically insulated from each other.

The first inorganic encapsulation layer EN1*a* may entirely cover the first groove GR1*a* along a profile of the elements constituting the first groove GR1*a* (e.g., may be disposed in the first groove GR1*a*) when viewed in a sectional view (e.g., in a cross-sectional view). In addition, the second inorganic encapsulation layer EN3*a* may cover the first inorganic encapsulation layer EN1*a*.

The first groove GR1*a* may serve to block moisture and impurities introduced from the second hole region HA2*a*. In more detail, moisture and impurities introduced from the second hole region HA2*a* may permeate into the display region DAa, so as to cause defects in the pixel PXa. The moisture and the impurities may permeate along an organic layer (e.g., along the organic light emitting layer ELa) or along a conductive layer (e.g., along the common electrode layer E2*a*). According to one or more embodiments of the present disclosure, in the region in which the first groove GR1*a* surrounding (e.g., around a periphery of) the second hole region HA2*a* is defined, each of the organic light emitting layer ELa and the common electrode layer E2*a* may be disconnected, and the first inorganic encapsulation layer EN1*a* may entirely cover the first groove GR1*a*. Accordingly, a permeation path of moisture and impurities may be blocked by the first groove GR1*a*.

The second groove GR2*a* may surround (e.g., around a periphery of) the first groove GR1*a*, and may have the same or substantially the same shape as that of the first groove GR1*a* when viewed in a sectional view (e.g., in a cross-sectional view). Accordingly, the second groove GR2*a* may serve to block moisture and impurities that have not been blocked by the first groove GR1*a*.

The third groove GR3*a* may surround (e.g., around a periphery of) the second groove GR2*a*, and may have the same or substantially the same shape as that of the first groove GR1*a* when viewed in a sectional view (e.g., in a cross-sectional view). Accordingly, the third groove GR3*a* may serve to block moisture and impurities that have not been blocked by the first groove GR1*a* and the second groove GR2*a*.

The dam DAMa may surround (e.g., around a periphery of) the third groove GR3*a*. The dam DAMa may be disposed on the gate insulating layer Gla. The organic light emitting layer ELa, the common electrode layer E2*a*, the first inorganic encapsulation layer EN1*a*, and the second inorganic encapsulation layer EN3*a* may extend in a direction from the display region DAa toward the second hole region HA2*a* to cover the dam DAMa.

The dam DAMa may serve to prevent or substantially prevent the organic encapsulation layer EN2*a* from overflowing in a direction toward the second hole region HA2*a* and the first hole region HA1*a*. As such, the dam DAMa may protrude from the gate insulating layer Gla to have a suitable height (e.g., a predetermined height). Accordingly, the organic encapsulation layer EN2*a* may not exist or substantially exist within a region surrounded (e.g., around a periphery thereof) by the dam DAMa. In this case, the first inorganic encapsulation layer EN1*a* and the second inorganic encapsulation layer EN3*a* may contact each other within the region surrounded (e.g., around a periphery thereof) by the dam DAMa.

The dam DAMa may include the same material as that of at least one of the first via insulating layer VIA1*a*, the second via insulating layer VIA2*a*, and/or the pixel defining layer PDLa. For example, the dam DAMa may have a multilayered structure in which two layers are stacked. In this case, a first layer of the dam DAMa may include the same material as that of the first via insulating layer VIA1*a*, and a second layer of the dam DAMa may include the same material as that of the second via insulating layer VIA2*a*. As another example, the dam DAMa may have a multilayered structure in which three layers are stacked. In this case, a first layer of the dam DAMa may include the same material as that of the first via insulating layer VIA1*a*, a second layer of the dam DAMa may include the same material as that of the second via insulating layer VIA2*a*, and a third layer of the dam DAMa may include the same material as that of the pixel defining layer PDLa. However, the structure of the dam DAMa is not limited to those described above, and the dam DAMa may have various suitable structures for preventing or substantially preventing the organic encapsulation layer EN2*a* from overflowing.

Each of the first via insulating layer VIA1*a*, the second via insulating layer VIA2*a*, and the pixel defining layer PDLa extending from the display region DAa to the hole periphery region HPAa may be disposed outside the region surrounded (e.g., around a periphery thereof) by the dam DAMa. In this case, each of the first via insulating layer VIA1*a*, the second via insulating layer VIA2*a*, and the pixel defining layer PDLa may be spaced apart from the dam DAMa.

The fourth groove GR4*a* may surround (e.g., around a periphery of) the dam DAMa, and may have a shape that is similar to or substantially similar to the shape of the first groove GR1*a* when viewed in a sectional view (e.g., in a cross-sectional view). In more detail, unlike the shape of the first groove GR1*a* when viewed in a sectional view (e.g., in a cross-sectional view), the organic encapsulation layer EN2*a* may be disposed on the first inorganic encapsulation layer EN1*a* that entirely covers the fourth groove GR4*a*. The fourth groove GR4*a* may serve to block moisture and impurities that have not been blocked by the first groove GR1*a*, the second groove GR2*a*, and the third groove GR3*a*.

According to an embodiment, a planarization layer OCa may be selectively further disposed at (e.g., in or on) the hole periphery region HPAa that is adjacent to the second hole region HA2*a*. The planarization layer OCa may include an organic insulating material, so that a top surface of the planarization layer OCa may be flat or substantially flat. The planarization layer OCa may compensate for a step formed by the organic encapsulation layer EN2*a* that is blocked by the dam DAMa. For example, a level of the top surface of the planarization layer OCa may be the same or substantially the same as a level of a top surface of the second inorganic encapsulation layer EN3*a*, so that the functional layer FLa may be disposed on a flat or substantially flat surface at (e.g., in or on) the hole periphery region HPAa. In this case, the planarization layer OCa may fill each of the first groove GR1*a*, the second groove GR2*a*, and the third groove GR3*a*.

An edge SUBa_E of the substrate SUBa may define a first through-hole formed through (e.g., penetrating) the substrate SUBa in the first hole region HA1*a*. In other words, the first hole region HA1*a* may be defined as a region overlapping with the first through-hole defined by the edge SUBa_E of the substrate SUBa. In this case, the edge SUBa_E of the substrate SUBa may surround (e.g., around a periphery of) the electronic device EE.

An edge BAR1a_E of the first inorganic barrier layer BAR1 a, an edge BSLa_E of the organic base layer BSLa, an edge BAR2*a*_E of the second inorganic barrier layer BAR2*a*, an edge Gla_E of the gate insulating layer Gla, an edge ELa_E of the organic light emitting layer ELa, an edge E2a_E of the common electrode layer E2*a*, an edge EN1a_E of the first inorganic encapsulation layer EN1*a*, an edge EN3a_E of the second inorganic encapsulation layer EN3*a*, an edge OCa_E of the planarization layer OCa, and an edge FLa_E of the functional layer FLa may define a second through-hole in the second hole region HA2*a*. In other words, the second hole region HA2*a* may be defined as a region overlapping with the second through-hole. In this case, the second through-hole may surround (e.g., around a periphery of) at least a portion of the electronic device EE.

The edge BAR1a_E of the first inorganic barrier layer BAR1 a, the edge BSLa_E of the organic base layer BSLa, the edge BAR2*a*_E of the second inorganic barrier layer BAR2*a*, the edge Gla_E of the gate insulating layer Gla, the edge ELa_E of the organic light emitting layer ELa, the edge E2a_E of the common electrode layer E2*a*, the edge EN1a_E of the first inorganic encapsulation layer EN1*a*, the edge EN3a_E of the second inorganic encapsulation layer EN3*a*, the edge OCa_E of the planarization layer OCa, and the edge FLa_E of the functional layer FLa, which define the second through-hole, may be aligned or substantially aligned with each other. In other words, side surfaces of the elements (e.g., the first inorganic barrier layer BAR1*a*, the organic base layer BSLa, the gate insulating layer Gla, the organic light emitting layer ELa, the common electrode layer E2*a*, the first inorganic encapsulation layer EN1*a*, the second inorganic encapsulation layer EN3*a*, the planarization layer OCa, and the functional layer FLa) defining the second through-hole may be aligned or substantially aligned with each other, and may define a flat or substantially flat surface when viewed in a sectional view (e.g., in a cross-sectional view).

An area of the second through-hole defined in the second hole region HA2*a* may be greater than an area of the first through-hole defined in the first hole region HA1*a* when viewed in a plan view, and the second through-hole may surround (e.g., around a periphery of) the first through-hole when viewed in a plan view. In this case, a portion of the top surface of the substrate SUBa that is adjacent to the first hole region HA1*a* may be exposed through the second through-hole. According to one or more embodiments of the present disclosure, the second through-hole may surround (e.g., around a periphery of) the first through-hole, so that generation of cracks may be reduced at a periphery of the hole region HAa when the hole region HAa is formed. This will be described in more detail below with reference to FIGS. 26 through 30.

Figure 6:
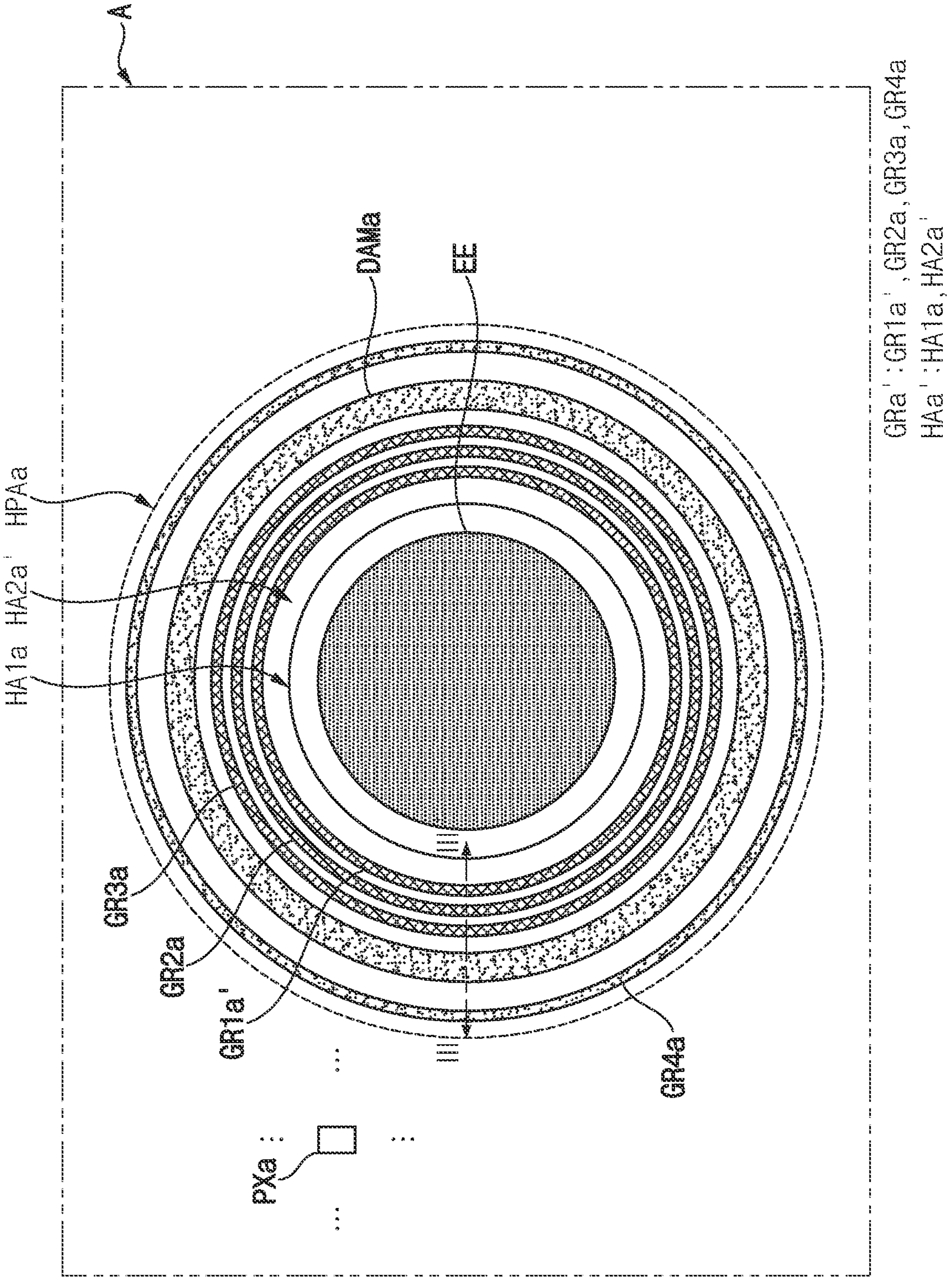
FIGS. 6 and 7 are views illustrating a hole region of the display device illustrated in FIG. 1, according to some embodiments.
Figure 7:
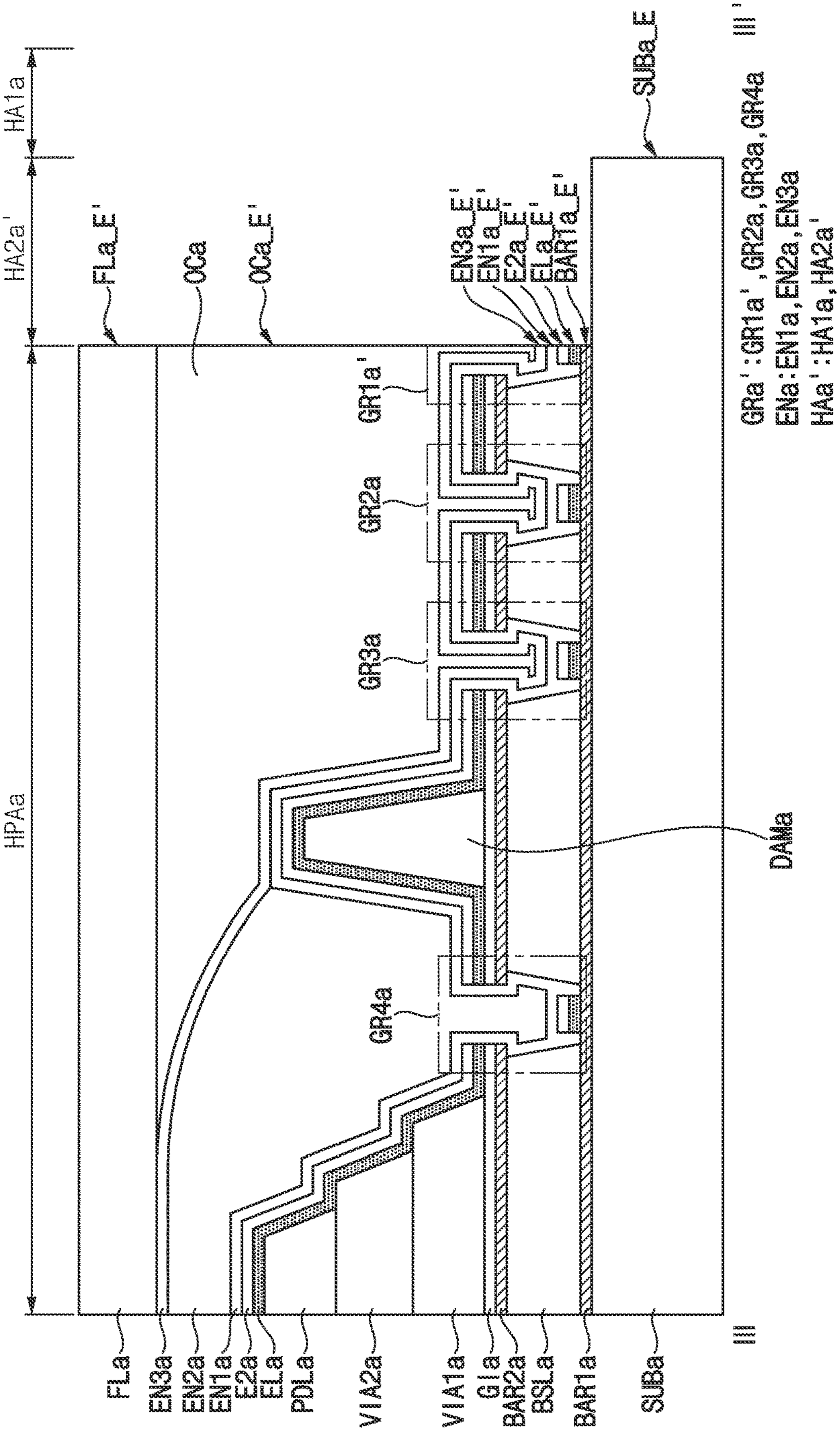

FIGS. 6 and 7 are views illustrating a hole region of the display device illustrated in FIG. 1, according to some embodiments. In the following description with reference to FIGS. 6 and 7, redundant description of the same or substantially the same (or similar) components and configurations as those described above with reference to FIGS. 2 through 5 may not be repeated.

Referring to FIGS. 6 and 7, a first groove GR1*a* may be formed by further removing a portion of the first groove GR1*a* described above with reference to FIGS. 4 and 5. As shown in FIG. 6, an inner edge of the first groove GR1*a* may be the same or substantially the same as an outer edge of a second hole region HA2*a*.

In this case, an edge BAR1*a*_E' of the first inorganic barrier layer BAR1*a*, an edge ELa_E' of the organic light emitting layer ELa, an edge E2a_E' of the common electrode layer E2*a*, an edge EN1a_E' of the first inorganic encapsulation layer EN1*a*, an edge EN3a_E' of the second inorganic encapsulation layer EN3*a*, an edge OCa_E' of the planarization layer OCa, and an edge FLa_E' of the functional layer FLa may define a second through-hole in the second hole region HA2*a* surrounding (e.g., around a periphery of) the first hole region HA1*a*. In other words, the second hole region HA2*a* may be defined as a region overlapping with the second through-hole. In this case, the second through-hole may surround (e.g., around a periphery of) at least a portion of the electronic device EE.

The edge BAR1 a_E' of the first inorganic barrier layer BAR1 a, the edge ELa_E' of the organic light emitting layer ELa, the edge E2a_E' of the common electrode layer E2*a*, the edge EN1a_E of the first inorganic encapsulation layer EN1*a*, the edge EN3a_E' of the second inorganic encapsulation layer EN3*a*, the edge OCa_E' of the planarization layer OCa, and the edge FLa_E' of the functional layer FLa may be aligned or substantially aligned with each other. In other words, side surfaces of the elements (e.g., the first inorganic barrier layer BAR1 a, the organic light emitting layer ELa, the common electrode layer E2*a*, the first inorganic encapsulation layer EN1*a*, the second inorganic encapsulation layer EN3*a*, the planarization layer OCa, and the functional layer FLa) defining the second through-hole may be aligned or substantially aligned with each other, and may define a flat or substantially flat surface when viewed in a sectional view (e.g., in a cross-sectional view).

Even in this case, an area of the second through-hole defined in the second hole region HA2*a* may be greater than an area of the first through-hole defined in the first hole region HA1*a* when viewed in a plan view, and the second through-hole may surround (e.g., around a periphery of) the first through-hole when viewed in a plan view. In this case, a portion of the top surface of the substrate SUBa that is adjacent to the first hole region HA1*a* may be exposed through the second through-hole. Accordingly, generation of cracks may be reduced at a periphery of the hole region HAa when the hole region HAa is formed.

Figure 8:
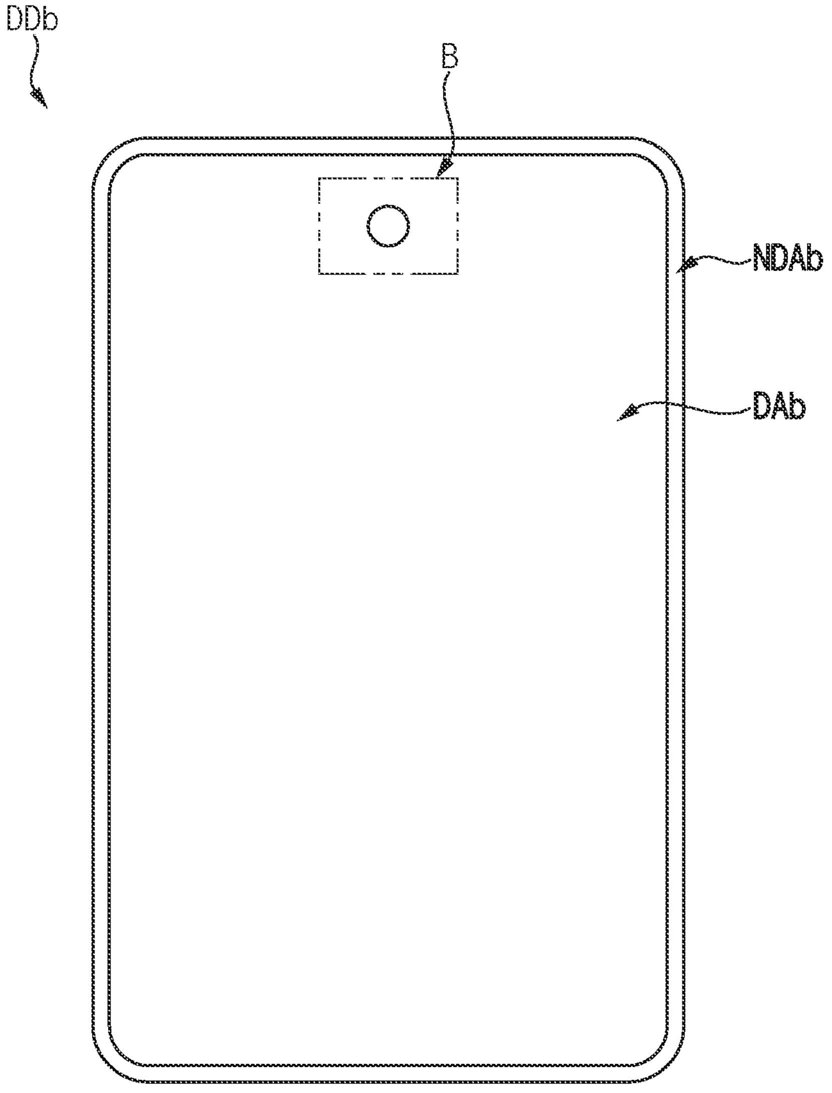
FIG. 8 is a plan view illustrating a display device according to an embodiment of the present disclosure.

FIG. 8 is a plan view illustrating a display device according to an embodiment of the present disclosure.

Referring to FIG. 8, a display device DDb may include a display region Dab, and a peripheral region NDAb surrounding (e.g., around a periphery of) the display region DAb.

The display region DAb may be the same or substantially the same as the display region DAa described above with reference to FIG. 1. For example, the display region DAb may be a region in which an image is displayed. The peripheral region NDAb may also be the same or substantially the same as the peripheral region NDAa described above with reference to FIG. 1.

A hole region, which is a region in which an image is not displayed, and in which an electronic device configured to detect light received from the outside is disposed, may be defined in at least a portion (e.g., a region B) of the display region DAb. For example, a camera may be disposed in the hole region. In this case, a user of the display device DDb may concurrently (e.g., simultaneously or substantially simultaneously) capture an image with the camera and view the image displayed in the display region DAb.

Figure 9:
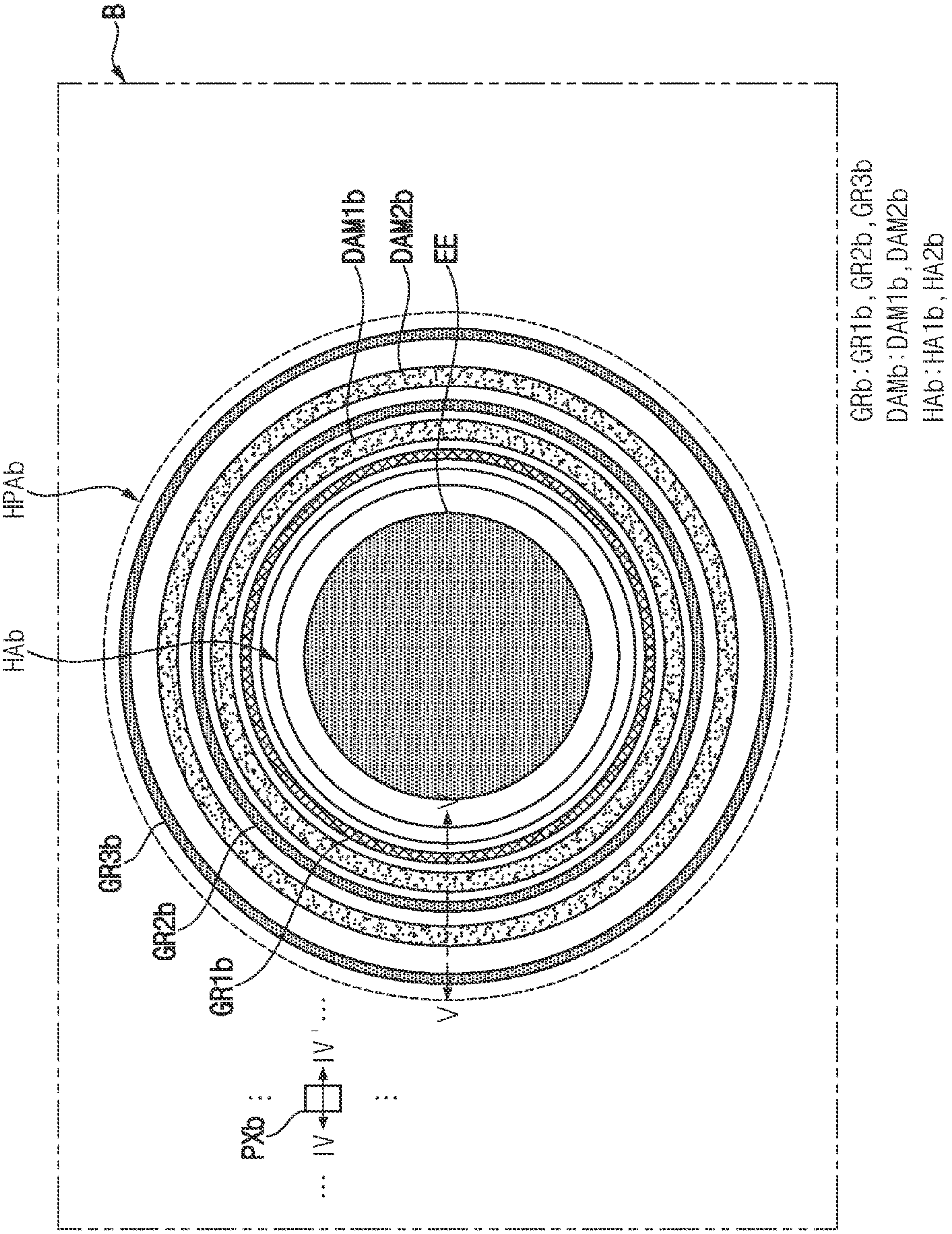
FIGS. 9-11 are views illustrating a hole region of the display device illustrated in FIG. 8, according to some embodiments.
Figure 10:
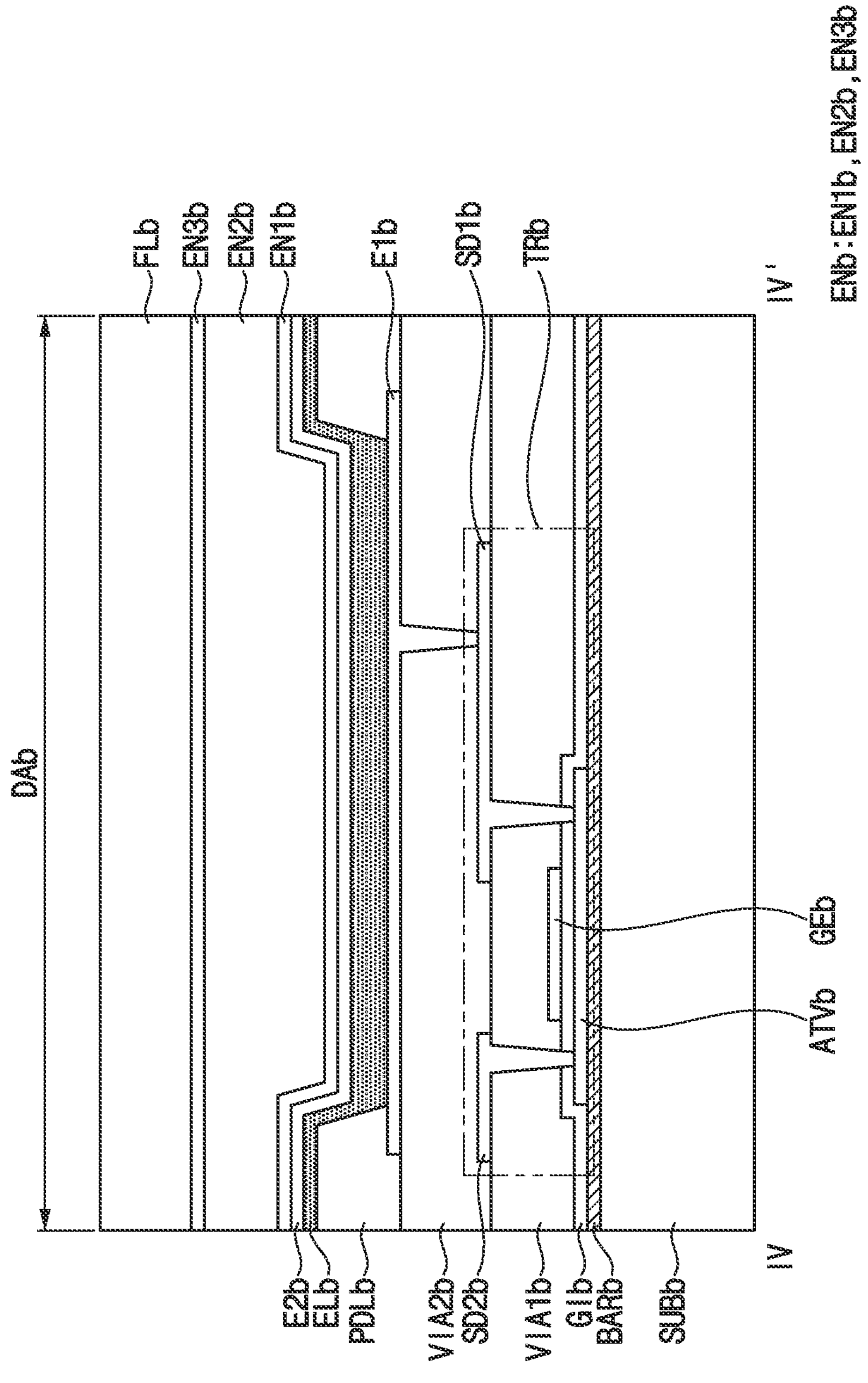
Figure 11:
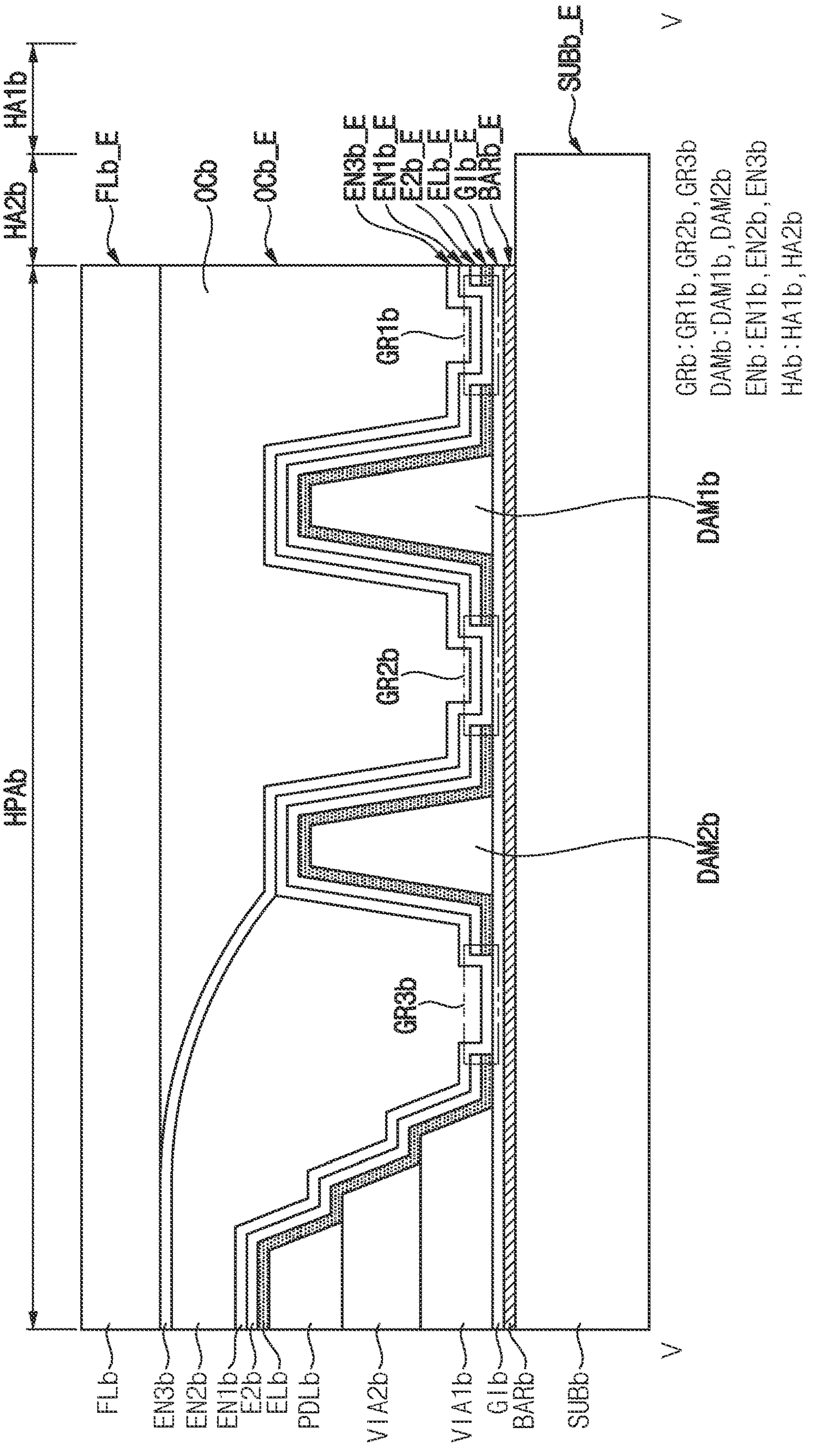

FIGS. 9 through 11 are views illustrating a hole region of the display device illustrated in FIG. 8, according to some embodiments. FIG. 9 is an enlarged plan view of the region B of FIG. 8. FIG. 10 is a sectional view taken along the line IV-IV' of FIG. 9. FIG. 11 is a sectional view taken along the line V-V' of FIG. 9.

Referring to FIGS. 8 and 9, a hole region HAb may be defined in (e.g., may penetrate) the portion (e.g., the region B) of the display region DAb. The hole region HAb may include a first hole region HA1*b*, and a second hole region HA2*b* surrounding (e.g., around a periphery of) the first hole region HA1*b*. In addition, a hole periphery region HPAb surrounding (e.g., around a periphery of) the second hole region HA2*b* may be defined between the display region DAb and the hole region HAb.

Each of the first hole region HA1*b* and the second hole region HA2*b* may be a region in which a through-hole formed through various elements included in the display device DDb is defined. An electronic device EE may be disposed inside the through-hole. According to one or more embodiments of the present disclosure, as shown in FIG. 9, when viewed in a plan view, the second hole region HA2*b* may surround (e.g., around a periphery of) the first hole region HA1*b*. In other words, an edge of the second hole region HA2*b* may be spaced apart from an edge of the first hole region HA1*b*, while surrounding (e.g., around a periphery of) the edge of the first hole region HA1*b*. The first hole region HA1*b* and the second hole region HA2*b* will be described in more detail below with reference to FIG. 11.

The hole periphery region HPAb may surround (e.g., around a peripheries of) the first hole region HA1*b* and the second hole region HA2*b* when viewed in a plan view. At least one groove and at least one dam may be formed at (e.g., in or on) the hole periphery region HPAb. For example, a first groove GR1*b* surrounding (e.g., around a periphery of) the second hole region HA2*b*, a first dam DAM1*b* surrounding (e.g., around a periphery of) the first groove GR1*b*, a second groove GR2*b* surrounding (e.g., around a periphery of) the first dam DAM1*b*, a second dam DAM2*b* surrounding (e.g., around a periphery of) the second groove GR2*b*, and a third groove GR3*b* surrounding (e.g., around a periphery of) the second dam DAM2*b* may be formed at (e.g., in or on) the hole periphery region HPAb.

The first to third grooves GR1*b*, GR2*b*, and GR3*b* may serve to block moisture and foreign substances permeating into the display region DAb from the first hole region HA1*b* and the second hole region HA2*b*. In addition, the first dam DAM1*b* and the second dam DAM2*b* may serve to prevent or substantially prevent the organic encapsulation layer disposed at (e.g., in or on) the display region DAb from overflowing into the first hole region HA1*b* and the second hole region HA2*b*. The groove and the dam formed at (e.g., in or on) the hole periphery region HPAb will be described in more detail below with reference to FIG. 11.

A pixel PXb may be disposed at (e.g., in or on) the display region DAb outside the hole periphery region HPAb. The pixel PXb may emit light, and a plurality of pixels PXb may be provided at (e.g., in or on) the display region DAb. Accordingly, an image may be displayed in the display region DAb by combining the light emitted from the pixels PXb.

Hereinafter, the pixel PXb of the display device DDb will be described in more detail with reference to FIG. 10.

Referring to FIG. 10, the display device DDb may include a substrate SUBb, an inorganic barrier layer BARb, an active layer ATVb, a gate insulating layer Glb, a gate electrode GEb, a first via insulating layer VIA1*b*, a first source-drain electrode SD1*b*, a second source-drain electrode SD2*b*, a second via insulating layer VIA2*b*, a pixel electrode E1*b*, a pixel defining layer PDLb, an organic light emitting layer ELb, a common electrode layer E2*b*, an encapsulation layer ENb, and a functional layer FLb. These elements may define the pixel PXb disposed at (e.g., in or on) the display region DAb.

The substrate SUBb, the active layer ATVb, the gate insulating layer Glb, the gate electrode GEb, the first via insulating layer VIA1*b*, the first source-drain electrode SD1*b*, the second source-drain electrode SD2*b*, the second via insulating layer VIA2*b*, the pixel electrode E1*b*, the pixel defining layer PDLb, the organic light emitting layer ELb, the common electrode layer E2*b*, the encapsulation layer ENb, and the functional layer FLb may be the same or substantially the same as the substrate SUBa, the active layer ATVa, the gate insulating layer Gla, the gate electrode GEa, the first via insulating layer VIA1*a*, the first source-drain electrode SD1*a*, the second source-drain electrode SD2*a*, the second via insulating layer VIA2*a*, the pixel electrode E1*a*, the pixel defining layer PDLa, the organic light emitting layer ELa, the common electrode layer E2*a*, the encapsulation layer ENa, and the functional layer FLa described above with reference to FIG. 3, and thus, redundant description thereof may not be repeated.

In addition, the inorganic barrier layer BARb may be the same or substantially the same as the first inorganic barrier layer BAR1 a described above with reference to FIG. 3, and thus, redundant description thereof may not be repeated.

In other words, when compared with the display device DDa described above with reference to FIG. 3, the organic base layer BSLa and the second inorganic barrier layer BAR2*a* may be omitted in the display device DDb. Accordingly, the display device DDb may have a relatively thinner thickness as compared with that of the display device DDa.

Hereinafter, the first hole region HA1*b*, the second hole region HA2*b*, and the hole periphery region HPAb will be described in more detail with reference to FIG. 11.

Referring to FIGS. 9 through 11, the substrate SUBb, the inorganic barrier layer BARb, the gate insulating layer Glb, the first via insulating layer VIA1*b*, the second via insulating layer VIA2*b*, the pixel defining layer PDLb, the organic light emitting layer ELb, the common electrode layer E2*b*, the encapsulation layer ENb, and the functional layer FLb may extend from the display region DAb to at least the hole periphery region HPAb.

The organic light emitting layer ELb and the common electrode layer E2*b* may define a groove GRb in the hole periphery region HPAb. The groove GRb may include, for example, a first groove GR1*b*, a second groove GR2*b*, and a third groove GR3*b*. The first dam DAM1*b* surrounding (e.g., around a periphery of) the first groove GR1*b* may be disposed between the first groove GR1*b* and the second groove GR2*b*. The second dam DAM2*b* surrounding (e.g., around a periphery of) the second groove GR2*b* may be disposed between the second groove GR2*b* and the third groove GR3*b*.

Each of the first groove GR1*b*, the second groove GR2*b*, and the third groove GR3*b* may be defined as a portion from which the organic light emitting layer ELb and the common electrode layer E2*b* are removed. For example, after the organic light emitting layer ELb and the common electrode layer E2*b* are formed over an entire area, the first groove GR1*b*, the second groove GR2*b*, and the third groove GR3*b* may be formed by removing portions of the organic light emitting layer ELb and the common electrode layer E2*b* corresponding to the first groove GR1*b*, the second groove GR2*b*, and the third groove GR3*b*.

A first inorganic encapsulation layer EN1*b* may entirely cover each of the first groove GR1*b*, the second groove GR2*b*, and the third groove GR3*b*. In addition, a second inorganic encapsulation layer EN3*b* may cover the first inorganic encapsulation layer EN1*b* covering each of the first groove GR1*b* and the second groove GR2*b*, and an organic encapsulation layer EN2*b* may be disposed on the first inorganic encapsulation layer EN1*b* covering the third groove GR3*b*.

The first groove GR1*b* may serve to block moisture and impurities introduced from the second hole region HA2*b*. In more detail, moisture and impurities introduced from the second hole region HA2*b* may permeate into the display region Dab, so as to cause defects in the pixel PXb. The moisture and the impurities may permeate along an organic layer (e.g., the organic light emitting layer ELb), or along a conductive layer (e.g., the common electrode layer E2*b*). However, according to one or more embodiments of the present disclosure, in a region in which the first groove GR1*b* is defined, each of the organic light emitting layer ELb and the common electrode layer E2*b* may be removed, and the first inorganic encapsulation layer EN1*b* may entirely cover the first groove GR1*b*. Accordingly, a permeation path of the moisture and the impurities may be blocked by the first groove GR1*b*.

The first dam DAM1*b* may surround (e.g., around a periphery of) the first groove GR1*b*. The first dam DAM1*b* may be disposed on the gate insulating layer Glb. In this case, the organic light emitting layer ELb, the common electrode layer E2*b*, the first inorganic encapsulation layer EN1*b*, and the second inorganic encapsulation layer EN3*b* may cover the first dam DAM1*b*.

The second groove GR2*b* may surround (e.g., around a periphery of) the first dam DAM1*b*. The second groove GR2*b* may serve to block moisture and impurities that have not been blocked by the first groove GR1*b*.

The second dam DAM2*b* may surround (e.g., around a periphery of) the second groove GR2*b*. The second dam DAM2*b* may be disposed on the gate insulating layer Glb. The organic light emitting layer ELb, the common electrode layer E2*b*, the first inorganic encapsulation layer EN1*b*, and the second inorganic encapsulation layer EN3*b* may cover the second dam DAM2*b*.

The second dam DAM2*b* may serve to prevent or substantially prevent the organic encapsulation layer EN2*b* from overflowing in a direction toward the second hole region HA2*b* and the first hole region HA1*b*. As such, the second dam DAM2*b* may protrude from the gate insulating layer Glb to have a suitable height (e.g., a predetermined height). Accordingly, the organic encapsulation layer EN2*b* may not exist or substantially exist within a region surrounded (e.g., around a periphery thereof) by the second dam DAM2*b*. In this case, the first inorganic encapsulation layer EN1*b* and the second inorganic encapsulation layer EN3*b* may contact each other within the region surrounded (e.g., around a periphery thereof) by the second dam DAM2*b*.

In this case, the first dam DAM1*b* may serve to further prevent or substantially prevent the organic encapsulation layer EN2*b* that has not been blocked by the second dam DAM2*b* from overflowing in the direction toward the second hole region HA2*b* and the first hole region HA1*b*. In addition, each of the first dam DAM1*b* and the second dam DAM2*b* may include the same material as that of at least one of the first via insulating layer VIA1*b*, the second via insulating layer VIA2*b*, and/or the pixel defining layer PDLb.

Each of the first via insulating layer VIA1*b*, the second via insulating layer VIA2*b*, and the pixel defining layer PDLb extending from the display region DAb to the hole periphery region HPAb may be disposed outside the region surrounded (e.g., around a periphery thereof) by the second dam DAM2*b*. In this case, each of the first via insulating layer VIA1*b*, the second via insulating layer VIA2*b*, and the pixel defining layer PDLb may be spaced apart from the second dam DAM2*b*.

The third groove GR3*b* may surround (e.g., around a periphery of) the second dam DAM2*b*. The third groove GR3*b* may serve to block moisture and impurities that have not blocked by the first groove GR1*b* and the second groove GR2*b*.

According to an embodiment, a planarization layer OCb may be selectively further disposed at (e.g., in or on) the hole periphery region HPAb that is adjacent to the second hole region HA2*b*. The planarization layer OCb may include an organic insulating material, so that a top surface of the planarization layer OCb may be flat or substantially flat. The planarization layer OCb may compensate for a step formed by the organic encapsulation layer EN2*b* that is blocked by the second dam DAM2*b*. For example, a level of the top surface of the planarization layer OCb may be the same or substantially the same as a level of a top surface of the second inorganic encapsulation layer EN3*b*, so that the functional layer FLb may be disposed on a flat or substantially flat surface at (e.g., in or on) the hole periphery region HPAb.

An edge SUBb_E of the substrate SUBb may define a first through-hole formed through the substrate SUBb in the first hole region HA1*b*. In other words, the first hole region HA1*b* may be defined as a region overlapping with the first through-hole defined by the edge SUBb_E of the substrate SUBb. In this case, the edge SUBb_E of the substrate SUBb may surround (e.g., around a periphery of) the electronic device EE.

An edge BARb_E of the inorganic barrier layer BARb, an edge Glb_E of the gate insulating layer Glb, an edge ELb_E of the organic light emitting layer ELb, an edge E2b_E of the common electrode layer E2*b*, an edge EN1b_E of the first inorganic encapsulation layer EN1*b*, an edge EN3b_E of the second inorganic encapsulation layer EN3*b*, an edge OCb_E of the planarization layer OCb, and an edge FLb_E of the functional layer FLb may define a second through-hole in the second hole region HA2*b*. In other words, the second hole region HA2*b* may be defined as a region overlapping with the second through-hole. In this case, the second through-hole may surround (e.g., around a periphery of) at least a portion of the electronic device EE.

The edge BARb_E of the inorganic barrier layer BARb, the edge Glb_E of the gate insulating layer Glb, the edge ELb_E of the organic light emitting layer ELb, the edge E2b_E of the common electrode layer E2*b*, the edge EN1b_E of the first inorganic encapsulation layer EN1*b*, the edge EN3b_E of the second inorganic encapsulation layer EN3*b*, the edge OCb_E of the planarization layer OCb, and the edge FLb_E of the functional layer FLb, which define the second through-hole, may be aligned or substantially aligned with each other. In other words, side surfaces of the elements (e.g., the inorganic barrier layer BARb, the gate insulating layer Glb, the organic light emitting layer ELb, the common electrode layer E2*b*, the first inorganic encapsulation layer EN1*b*, the second inorganic encapsulation layer EN3*b*, the planarization layer OCb, and the functional layer FLb) defining the second through-hole may be aligned or substantially aligned with each other, and may define a flat or substantially flat surface when viewed in a sectional view (e.g., in a cross-sectional view).

An area of the second through-hole defined in the second hole region HA2*b* may be greater than an area of the first through-hole defined in the first hole region HA1*b* when viewed in a plan view, and the second through-hole may surround (e.g., around a periphery of) the first through-hole when viewed in a plan view. In this case, a portion of the top surface of the substrate SUBb that is adjacent to the first hole region HA1*b* may be exposed through the second through-hole. According to one or more embodiments of the present disclosure, the second through-hole may surround (e.g., around a periphery of) the first through-hole, so that generation of cracks may be reduced at a periphery of the hole region HAb when the hole region HAb is formed. This will be described in more detail below with reference to FIGS. 26 through 30.

Figure 12:
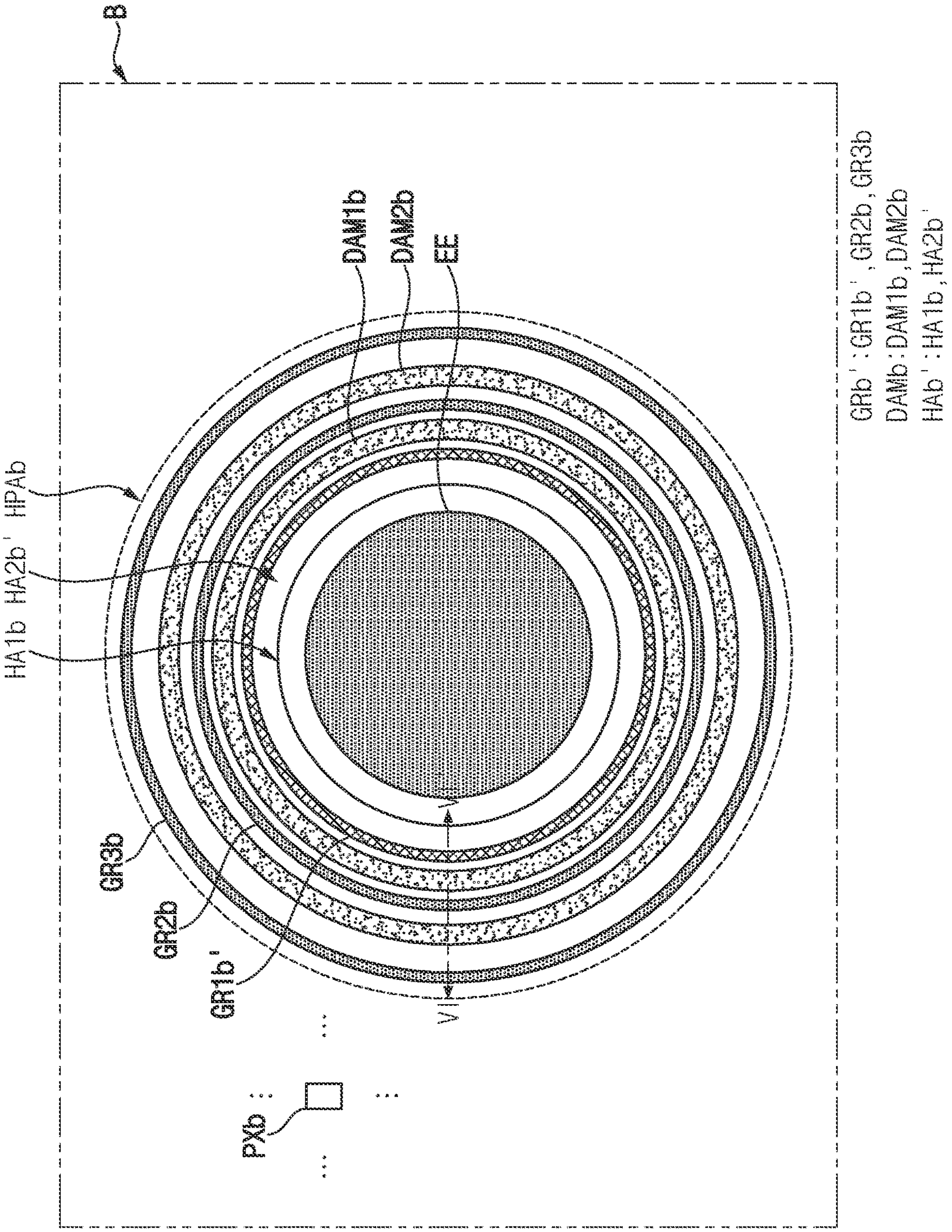
FIGS. 12 and 13 are views illustrating a hole region of the display device illustrated in FIG. 8, according to some embodiments.
Figure 13:
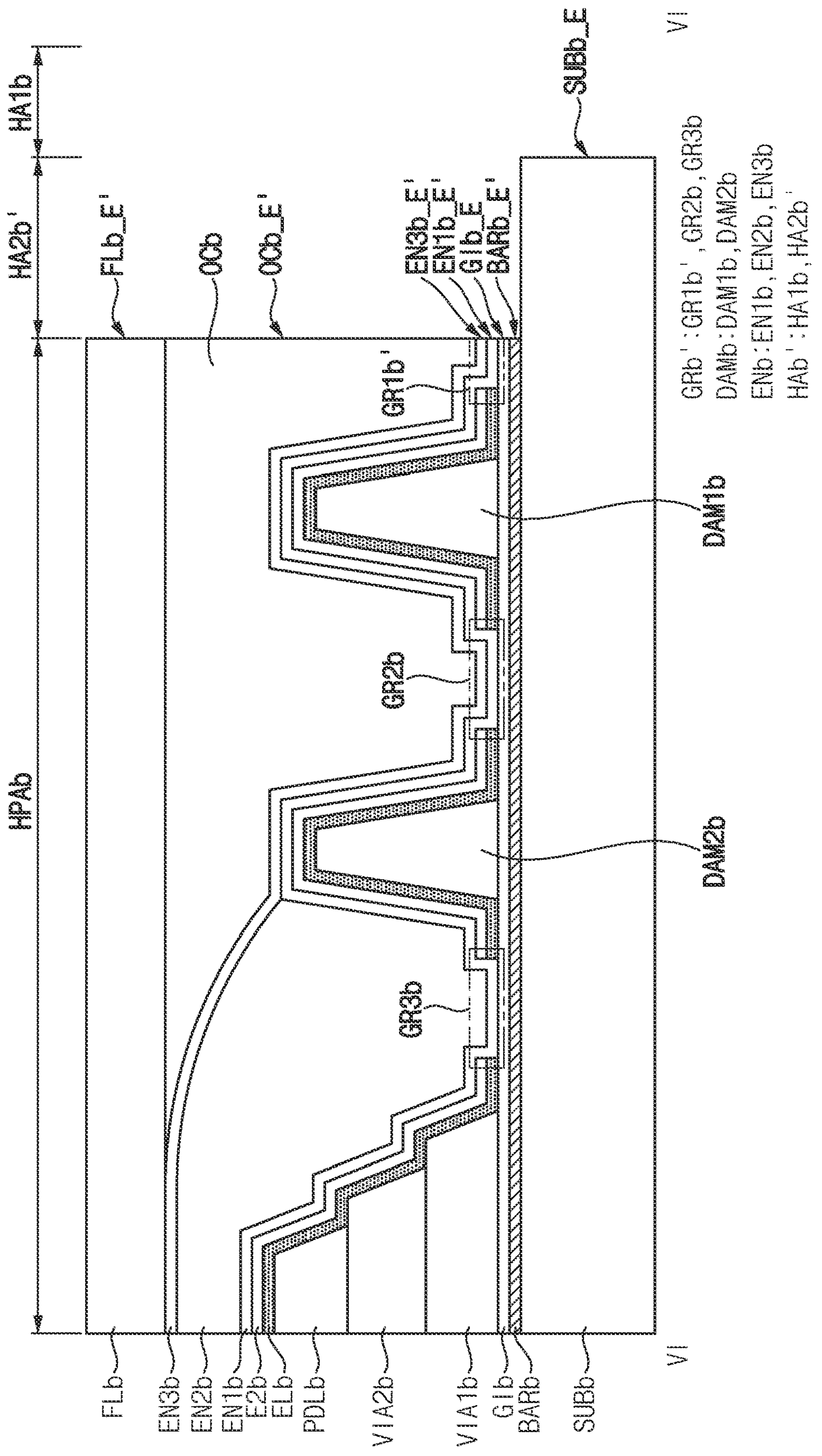

FIGS. 12 and 13 are views illustrating a hole region of the display device illustrated in FIG. 8, according to some embodiments. In the following description with reference to FIGS>12 and 13, redundant description of the same or substantially the same elements and configurations as those described above with reference to FIGS. 9 through 11 may not be repeated.

Referring to FIGS. 12 and 13, a first groove GR1*b* may be formed by further removing a portion of the first groove GR1*b* described above with reference to FIGS. 9 through 11. As shown in FIG. 12, an inner edge of the first groove GR1*b* may be the same or substantially the same as an outer edge of a second hole region HA2*b'*.

In this case, an edge BARb_E' of the inorganic barrier layer BARb, an edge Glb_E' of the gate insulating layer Glb, an edge EN1b_E' of the first inorganic encapsulation layer EN1*b*, an edge EN3b_E' of the second inorganic encapsulation layer EN3*b*, an edge OCb_E' of the planarization layer OCb, and an edge FLb_E' of the functional layer FLb may define a second through-hole in the second hole region HA2*b*' surrounding (e.g., around a periphery of) the first hole region HA1*b*. In other words, the second hole region HA2*b*' may be defined as a region overlapping with the second through-hole. In this case, the second through-hole may surround (e.g., around a periphery of) at least a portion of the electronic device EE.

The edge BARb_E' of the inorganic barrier layer BARb, the edge Glb_E' of the gate insulating layer Glb, the edge EN1b_E of the first inorganic encapsulation layer EN1*b*, the edge EN3b_E' of the second inorganic encapsulation layer EN3*b*, the edge OCb_E' of the planarization layer OCb, and the edge FLb_E' of the functional layer FLb may be aligned or substantially aligned with each other. In other words, side surfaces of the elements (e.g., the inorganic barrier layer BARb, the gate insulating layer Glb, the first inorganic encapsulation layer EN1*b*, the second inorganic encapsulation layer EN3*b*, the planarization layer OCb, and the functional layer FLb) defining the second through-hole may be aligned or substantially aligned with each other, and may define a flat or substantially flat surface when viewed in a sectional view (e.g., in a cross-sectional view).

Even in this case, an area of the second through-hole defined in the second hole region HA2*b*' may be greater than an area of the first through-hole defined in the first hole region HA1*b* when viewed in a plan view, and the second through-hole may surround (e.g., around a periphery of) the first through-hole when viewed in a plan view. In this case, a portion of the top surface of the substrate SUBb that is adjacent to the first hole region HA1*b* may be exposed through the second through-hole. Accordingly, generation of cracks may be reduced at a periphery of the hole region HAb' when the hole region HAb' is formed.

Figure 14:
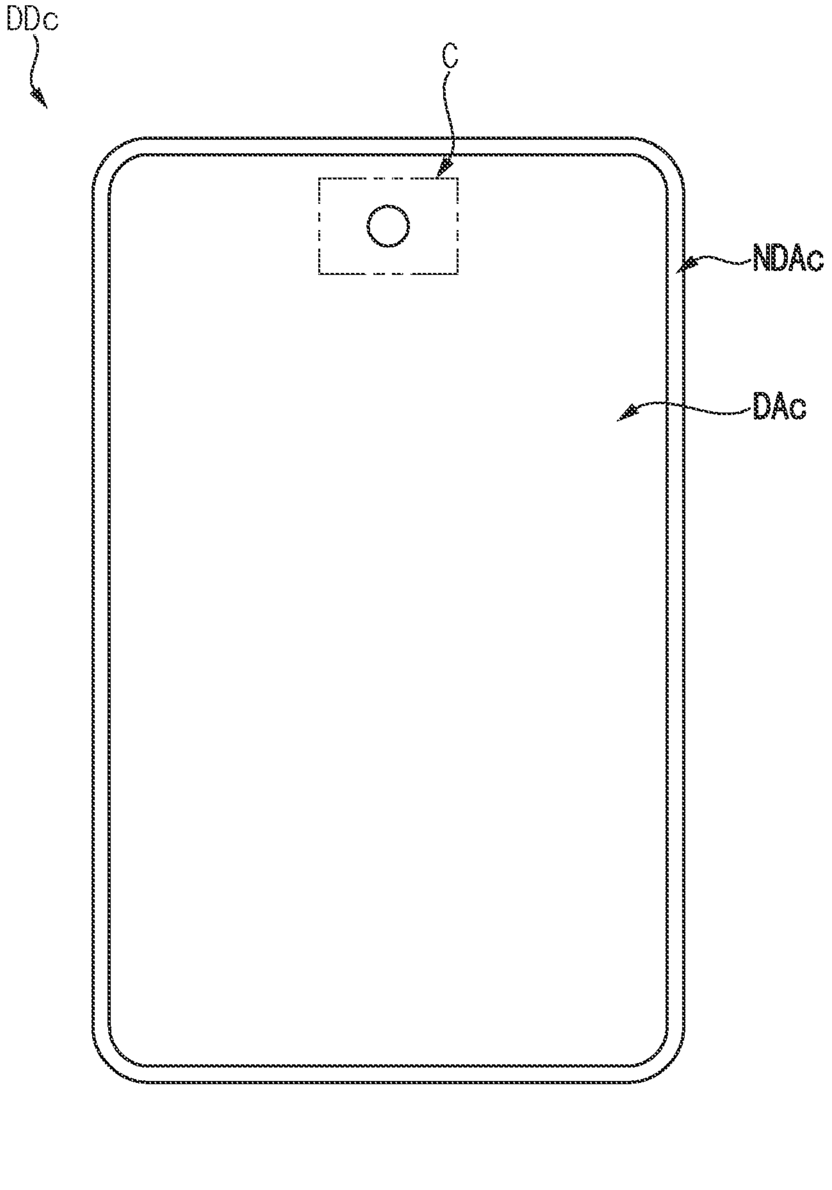
FIG. 14 is a plan view illustrating a display device according an embodiment of the present disclosure.

FIG. 14 is a plan view illustrating a display device according to an embodiment of the present disclosure.

Referring to FIG. 14, a display device DDc may include a display region DAc, and a peripheral region NDAc surrounding (e.g., around a periphery of) the display region DAc.

The display region DAc may be the same or substantially the same as the display region DAa described above with reference to FIG. 1. For example, the display region DAc may be a region in which an image is displayed. The peripheral region NDAc may also be the same or substantially the same as the peripheral region NDAa described above with reference to FIG. 1.

A hole region, which is a region in which an image is not displayed, and in which an electronic device configured to detect light received from the outside is disposed, may be defined in at least a portion (e.g., a region C) of the display region DAc. For example, a camera may be disposed in the hole region. In this case, a user of the display device DDc may concurrently (e.g., simultaneously or substantially simultaneously) capture an image with the camera and view the image displayed in the display region DAc.

Figure 15:
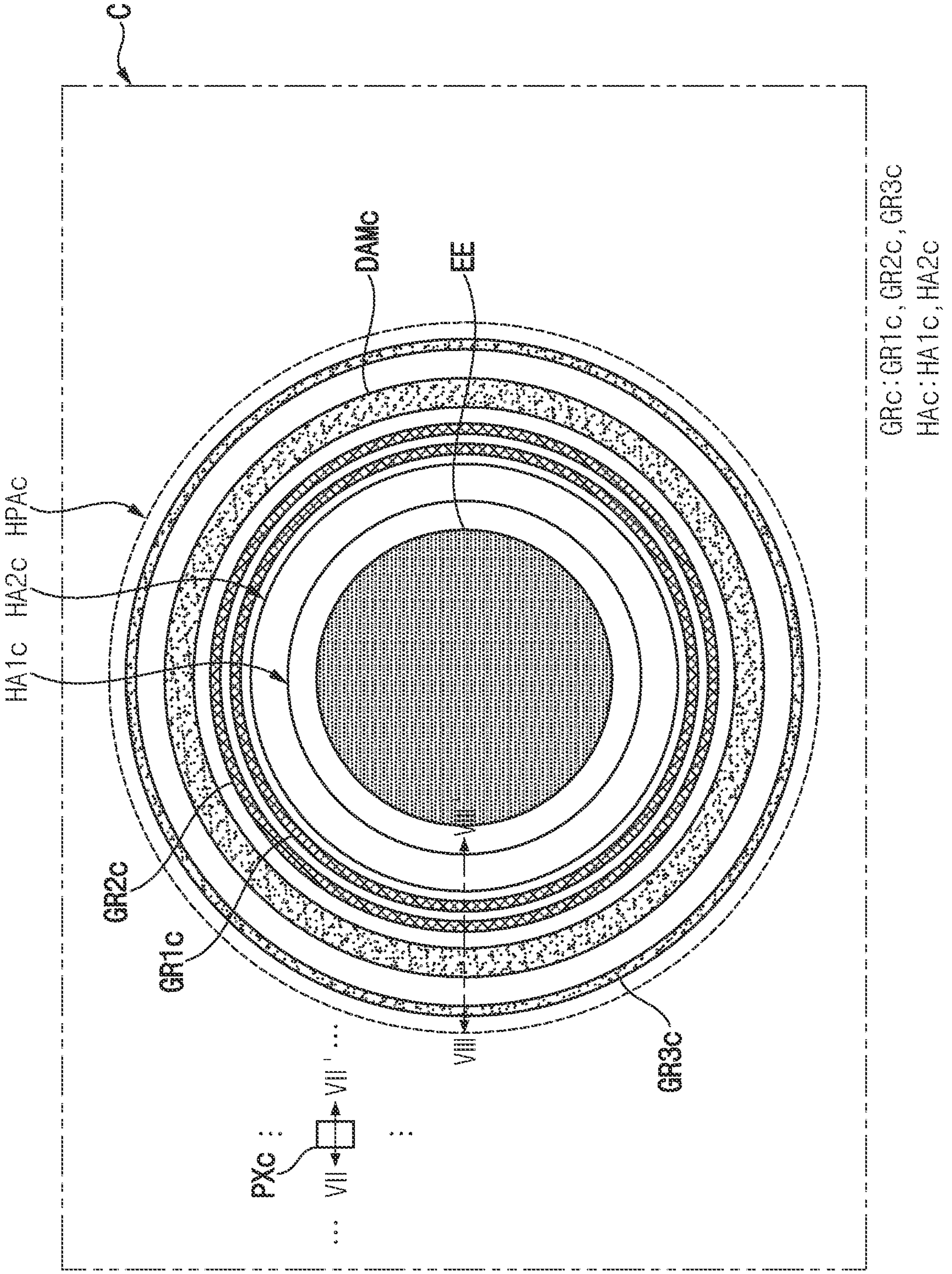
FIGS. 15-18 are views illustrating a hole region of the display device illustrated in FIG. 14, according to some embodiments.
Figure 16:
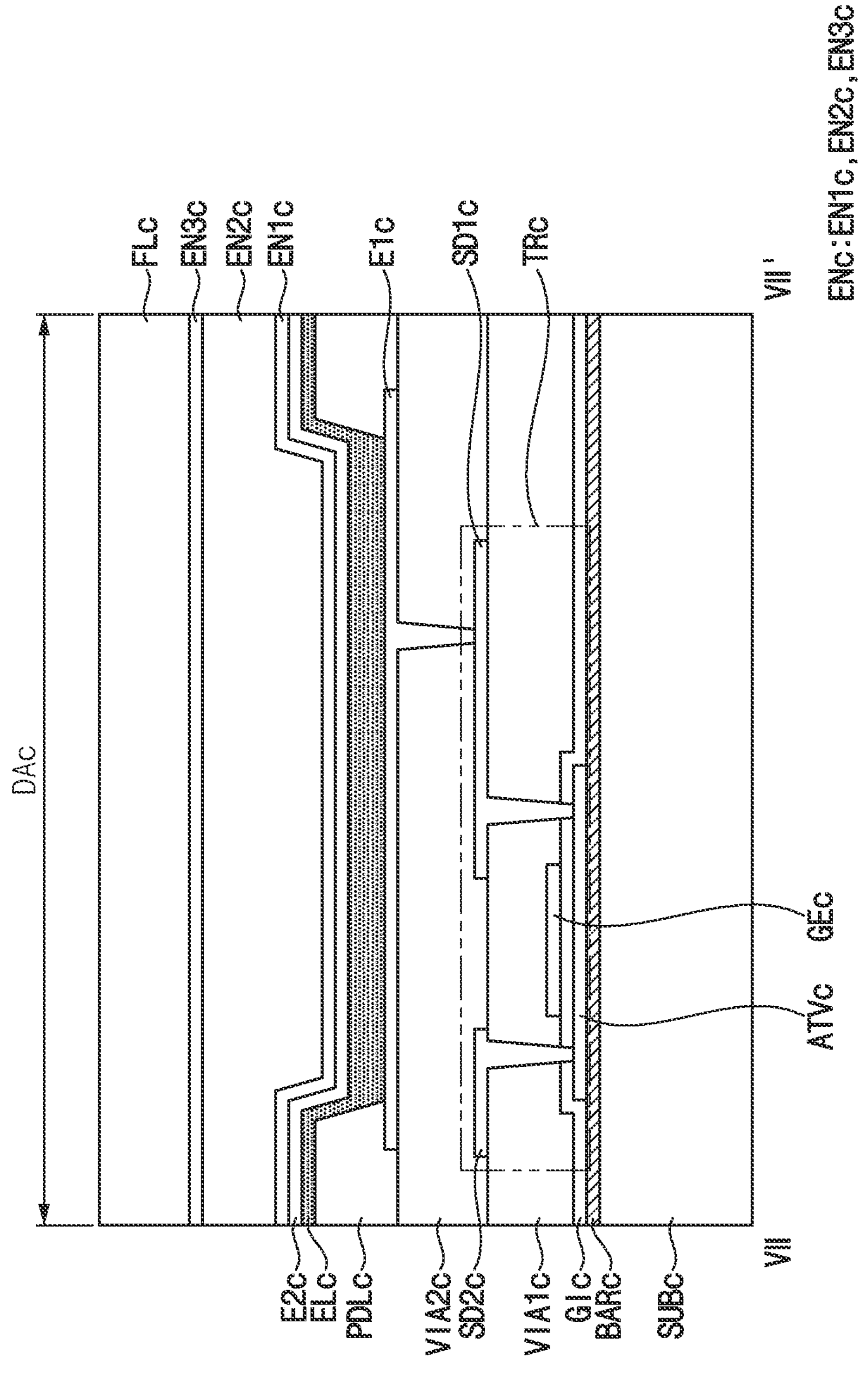
Figure 17:
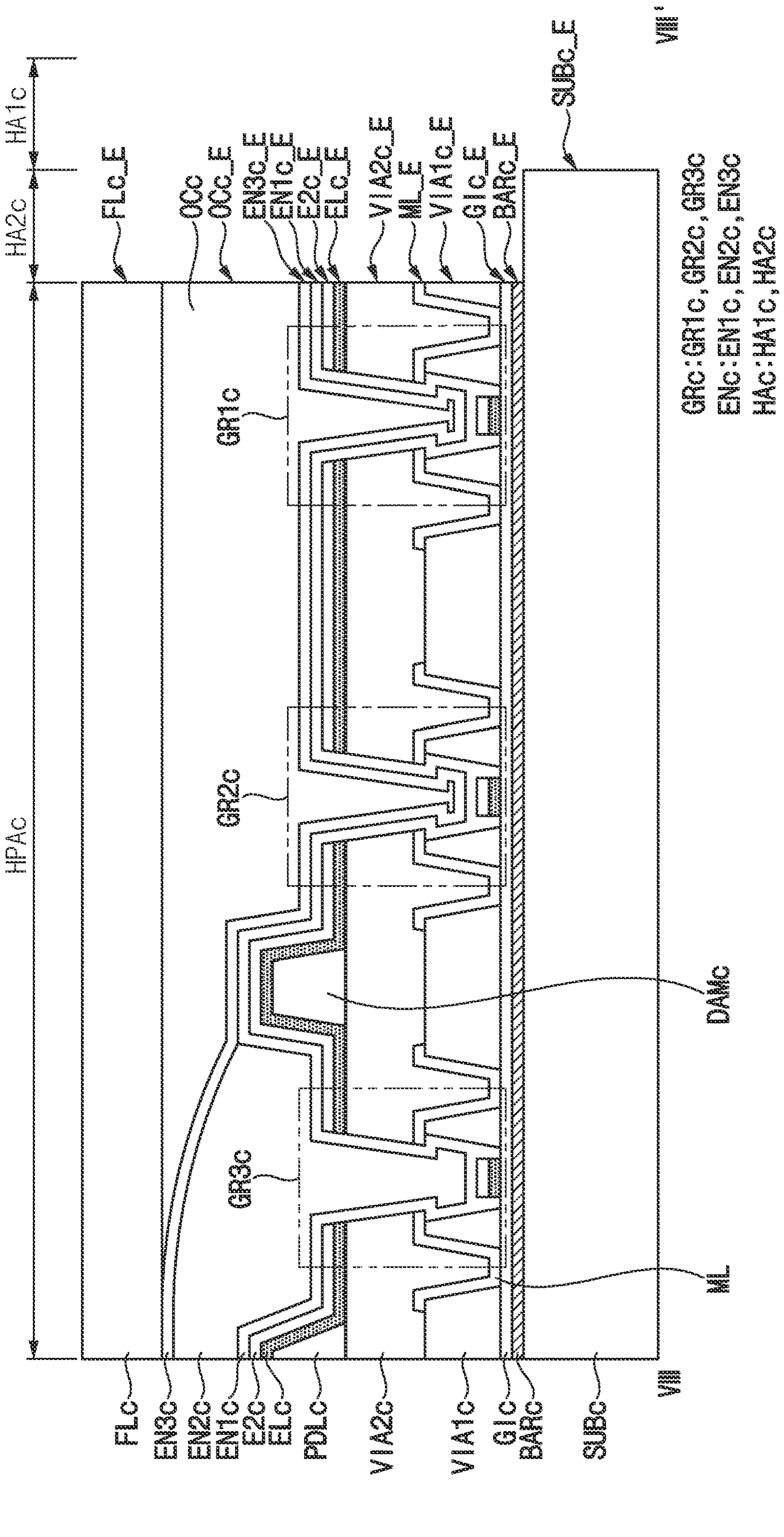
Figure 18:
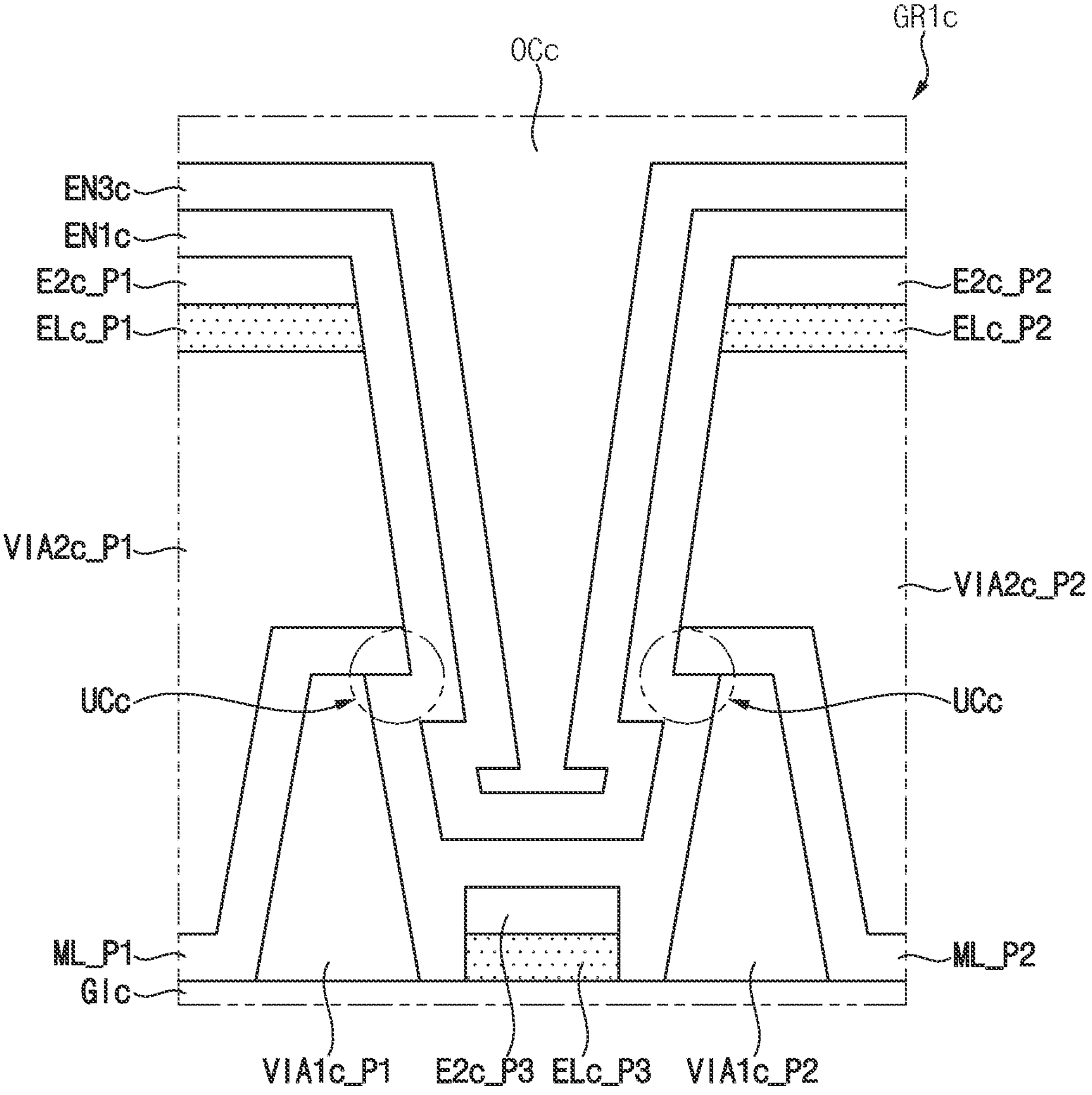

FIGS. 15 through 18 are views illustrating a hole region of the display device illustrated in FIG. 14, according to some embodiments. FIG. 15 is an enlarged plan view of the region C of FIG. 14. FIG. 16 is a sectional view taken along the line VII-VII' of FIG. 15. FIG. 17 is a sectional view taken along the line VIII-VIII' of FIG. 15. FIG. 18 is a sectional view illustrating a first groove of FIG. 17.

Referring to FIGS. 14 and 15, a hole region HAc may be defined in the portion (e.g., the region C) of the display region DAc. The hole region HAc may include a first hole region HA1*c*, and a second hole region HA2*c* surrounding (e.g., around a periphery of) the first hole region HA1*c*. In addition, a hole periphery region HPAc surrounding (e.g., around a periphery of) the second hole region HA2*c* may be defined between the display region DAc and the hole region HAc.

Each of the first hole region HA1*c* and the second hole region HA2*c* may be a region in which a through-hole formed through various elements included in the display device DDc is defined. An electronic device EE may be disposed inside the through-hole. According to one or more embodiments of the present disclosure, as shown in FIG. 15, when viewed in a plan view, the second hole region HA2*c* may surround (e.g., around a periphery of) the first hole region HA1*c*. In other words, an edge of the second hole region HA2*c* may be spaced apart from an edge of the first hole region HA1*c*, while surrounding (e.g., around a periphery of) the edge of the first hole region HA1*c*. The first hole region HA1*c* and the second hole region HA2*c* will be described in more detail below with reference to FIG. 17.

The hole periphery region HPAc may surround (e.g., around peripheries of) the first hole region HA1*c* and the second hole region HA2*c* when viewed in a plan view. At least one groove and at least one dam may be formed at (e.g., in or on) the hole periphery region HPAc. For example, a first groove GR1*c* surrounding (e.g., around a periphery of) the second hole region HA2*c*, a second groove GR2*c* surrounding (e.g., around a periphery of) the first groove GR1*c*, a dam DAMc surrounding (e.g., around a periphery of) the second groove GR2*c*, and a third groove GR3*c* surrounding (e.g., around a periphery of) the dam DAMc may be formed at (e.g., in or on) the hole periphery region HPAc.

The first to third grooves GR1*c*, GR2*c*, and GR3*c* may serve to block moisture and foreign substances permeating into the display region DAc from the first hole region HA1*c* and the second hole region HA2*c*. In addition, the dam DAMc may serve to prevent or substantially prevent the organic encapsulation layer disposed at (e.g., in or on) the display region DAc from overflowing into the first hole region HA1*c* and the second hole region HA2*c*. The groove and the dam formed at (e.g., in or on) the hole periphery region HPAc will be described in more detail below with reference to FIG. 17.

A pixel PXc may be disposed at (e.g., in or on) the display region DAc outside the hole periphery region HPAc. The pixel PXc may emit light, and a plurality of pixels PXc may be provided at (e.g., in or on) the display region DAc. Accordingly, an image may be displayed in the display region DAc by combining the light emitted from the pixels PXc.

Hereinafter, the pixel PXc of the display device DDc will be described in more detail with reference to FIG. 16.

Referring to FIG. 16, the display device DDc may include a substrate SUBc, an inorganic barrier layer BARc, an active layer ATVc, a gate insulating layer Glc, a gate electrode GEc, a first via insulating layer VIA1*c*, a first source-drain electrode SD1*c*, a second source-drain electrode SD2*c*, a second via insulating layer VIA2*c*, a pixel electrode E1*c*, a pixel defining layer PDLc, an organic light emitting layer ELc, a common electrode layer E2*c*, an encapsulation layer ENc, and a functional layer FLc. These elements may define the pixel PXc disposed at (e.g., in or on) the display region DAc.

The substrate SUBc, the active layer ATVc, the gate insulating layer Glc, the gate electrode GEc, the first via insulating layer VIA1*c*, the first source-drain electrode SD1*c*, the second source-drain electrode SD2*c*, the second via insulating layer VIA2*c*, the pixel electrode E1*c*, the pixel defining layer PDLc, the organic light emitting layer ELc, the common electrode layer E2*c*, the encapsulation layer ENc, and the functional layer FLc may be the same or substantially the same as the substrate SUBa, the active layer ATVa, the gate insulating layer Gla, the gate electrode GEa, the first via insulating layer VIA1*a*, the first source-drain electrode SD1*a*, the second source-drain electrode SD2*a*, the second via insulating layer VIA2*a*, the pixel electrode E1*a*, the pixel defining layer PDLa, the organic light emitting layer ELa, the common electrode layer E2*a*, the encapsulation layer ENa, and the functional layer FLa described with above reference to FIG. 3, and thus, redundant description thereof may not be repeated.

In addition, the inorganic barrier layer BARc may be the same or substantially the same as the first inorganic barrier layer BAR1 a described above with reference to FIG. 3, and thus, redundant description thereof may not be repeated.

In other words, when compared with the display device DDa described above with reference to FIG. 3, the organic base layer BSLa and the second inorganic barrier layer BAR2*a* may be omitted in the display device DDc. Accordingly, the display device DDc may have a relatively thinner thickness as compared with that of the display device DDa.

Hereinafter, the first hole region HA1*c*, the second hole region HA2*c*, and the hole periphery region HPAc will be described in more detail with reference to FIGS. 17 and 18.

Referring to FIGS. 15, 17, and 18, the substrate SUBc, the inorganic barrier layer BARc, the gate insulating layer Glc, the first via insulating layer VIA1*c*, the second via insulating layer VIA2*c*, the pixel defining layer PDLc, the organic light emitting layer ELc, the common electrode layer E2*c*, the encapsulation layer ENc, and the functional layer FLc may extend from the display region DAc to at least the hole periphery region HPAc. In addition, a pattern layer ML including the same or substantially the same material as that of each of the first source-drain electrode SD1*c* and the second source-drain electrode SD2*c* may be disposed at (e.g., in or on) the hole periphery region HPAc.

The first via insulating layer VIA1*c*, the pattern layer ML, and the second via insulating layer VIA2*c* may define a groove GRc in the hole periphery region HPAc. The groove GRc may include, for example, a first groove GR1*c*, a second groove GR2*c*, and a third groove GR3*c*. The dam DAMc surrounding (e.g., around a periphery of) the second groove GR2*c* may be disposed between the second groove GR2*c* and the third groove GR3*c*.

The first groove GR1*c* may include a first opening, a second opening, and a third opening. The first opening may be defined by the first via insulating layer VIA1*c*, and may expose a portion of a top surface of the gate insulating layer Glc. The second opening may be defined by the pattern layer ML to overlap with the first opening. The third opening may be defined by the second via insulating layer VIA2*c* to overlap with the second opening.

For example, the first opening may be defined as a space between a first portion VIA1c_P1 of the first via insulating layer VIA1*c* and a second portion VIA1c_P2 of the first via insulating layer VIA1*c*, which are disposed on the gate insulating layer Glc while being spaced apart from each other. The second opening may be defined as a space between a first portion ML_P1 of the pattern layer ML and a second portion ML_P2 of the pattern layer ML, which are disposed on the first via insulating layer VIA1*c* while being spaced apart from each other. The third opening may be defined as a space between a first portion VIA2c_P1 of the second via insulating layer VIA2*c* and a second portion VIA2c_P2 of the second via insulating layer VIA2*c*, which are disposed on the pattern layer ML while being spaced apart from each other.

According to an embodiment, a first trench formed in the first via insulating layer VIA1*c* in a region adjacent to one side of the first groove GR1*c* and a second trench formed in the first via insulating layer VIA1*c* in a region adjacent to an opposite side of the one side of the first groove GR1*c* may be defined in the first via insulating layer VIA1*c*. In this case, the first portion ML_P1 of the pattern layer ML may cover the first trench, and the second portion ML_P2 of the pattern layer ML may cover the second trench.

According to an embodiment, as shown in FIG. 18, the first opening may have a shape having a width that decreases (e.g., that gradually decreases) in a direction toward the gate insulating layer Glc. In other words, each of the first portion VIA1c_P1 of the first via insulating layer VIA1*c* and the second portion VIA1c_P2 of the first via insulating layer VIA1*c* may have a positively tapered shape with respect to the top surface of the gate insulating layer Glc.

In addition, a width of the second opening may be less than a width of the first opening in a region that is adjacent to the second opening when viewed in a sectional view (e.g., in a cross-sectional view). Accordingly, an undercut region UCc in which a bottom surface of the first portion ML_P1 of the pattern layer ML is exposed may be defined in a region that is adjacent to an interface between the first portion ML_P1 of the pattern layer ML and the first portion VIA1c_P1 of the first via insulating layer VIA1*c*. Similarly, an undercut region UCc in which a bottom surface of the second portion ML_P2 of the pattern layer ML is exposed may be defined in a region that is adjacent to an interface between the second portion ML_P2 of the pattern layer ML and the second portion VIA1c_P2 of the first via insulating layer VIA1*c*.

In this case, each of the organic light emitting layer ELc and the common electrode layer E2*c* disposed on the second via insulating layer VIA2*c* may be disconnected along a region in which the first groove GR1*c* is defined by a step between the pattern layer ML and the first via insulating layer VIA1*c* in the undercut region UCc.

In more detail, a first portion ELc_P1 of the organic light emitting layer ELc and a first portion E2c_P1 of the common electrode layer E2*c* may be sequentially stacked on the first portion VIA2c_P1 of the second via insulating layer VIA2*c*. A second portion ELc_P2 of the organic light emitting layer ELc and a second portion E2c_P2 of the common electrode layer E2*c* may be sequentially stacked on the second portion VIA2c_P2 of the second via insulating layer VIA2*c*. In addition, a third portion ELc_P3 of the organic light emitting layer ELc and a third portion E2c_P3 of the common electrode layer E2*c* may be sequentially stacked on the gate insulating layer Glc within the first groove GR1*c*.

Each of the third portion ELc_P3 of the organic light emitting layer ELc and the third portion E2c_P3 of the common electrode layer E2*c* may be spaced apart from the first portion ELc_P1 of the organic light emitting layer ELc, the first portion E2c_P1 of the common electrode layer E2*c*, the second portion ELc_P2 of the organic light emitting layer ELc, and the second portion E2c_P2 of the common electrode layer E2*c*. Accordingly, each of the organic light emitting layer ELc and the common electrode layer E2*c* may be disconnected in the region in which the first groove GR1*c* is defined. For example, the first portion ELc_P1 of the organic light emitting layer ELc and the second portion ELc_P2 of the organic light emitting layer ELc may be spaced apart from each other, while being electrically insulated from each other. The first portion E2c_P1 of the common electrode layer E2*c* and the second portion E2c_P2 of the common electrode layer E2*c* may be spaced apart from each other, while being electrically insulated from each other.

The first inorganic encapsulation layer EN1*c* may entirely cover the first groove GR1*c* along a profile of the elements constituting the first groove GR1*c* (e.g., may be disposed in the first groove GR1*c*) when viewed in a sectional view (e.g., in a cross-sectional view). In addition, the second inorganic encapsulation layer EN3*c* may cover the first inorganic encapsulation layer EN1*c*.

The first groove GR1*c* may serve to block moisture and impurities introduced from the second hole region HA2*c*. In more detail, moisture and impurities introduced from the second hole region HA2*c* may permeate into the display region DAc, so as to cause defects in the pixel PXc. The moisture and the impurities may permeate along an organic layer (e.g., the organic light emitting layer ELc), or along a conductive layer (e.g., the common electrode layer E2*c*). According to one or more embodiments of the present disclosure, in the region in which the first groove GR1*c* surrounding (e.g., around a periphery of) the second hole region HA2*c* is defined, each of the organic light emitting layer ELc and the common electrode layer E2*c* may be disconnected, and the first inorganic encapsulation layer EN1*c* may entirely cover the first groove GR1*c*. Accordingly, a permeation path of the moisture and the impurities may be blocked by the first groove GR1*c*.

The second groove GR2*c* may surround (e.g., around a periphery of) the first groove GR1*c*, and may have the same or substantially the same shape as that of the first groove GR1*c* when viewed in a sectional view (e.g., in a cross-sectional view). Accordingly, the second groove GR2*c* may serve to block moisture and impurities that have not been blocked by the first groove GR1*c*.

The dam DAMc may surround (e.g., around a periphery of) the second groove GR2*c*. The dam DAMc may be disposed on the second via insulating layer VIA2*c*. The organic light emitting layer ELc, the common electrode layer E2*c*, the first inorganic encapsulation layer EN1*c*, and the second inorganic encapsulation layer EN3*c* may extend in a direction from the display region DAc toward the second hole region HA2*c* so as to cover the dam DAMc.

The dam DAMc may serve to prevent or substantially prevent the organic encapsulation layer EN2*c* from over-flowing in a direction toward the second hole region HA2*c* and the first hole region HA1*c*. As such, the dam DAMc may protrude from the second via insulating layer VIA2*c* to have a suitable height (e.g., a predetermined height). Accordingly, the organic encapsulation layer EN2*c* may not exist or substantially exist within a region surrounded (e.g., around a periphery thereof) by the dam DAMc. In this case, the first inorganic encapsulation layer EN1*c* and the second inorganic encapsulation layer EN3*c* may contact each other within the region surrounded (e.g., around a periphery thereof) by the dam DAMc.

The dam DAMc may include the same material as that of the pixel defining layer PDLc. For example, the dam DAMc may have a single-layer structure including the same material as a material included in the pixel defining layer PDLc. However, the structure of the dam DAMc is not limited to those described above, and the dam DAMc may have various suitable structures for preventing or substantially preventing the organic encapsulation layer EN2*c* from over-flowing.

The third groove GR3*c* may surround (e.g., around a periphery of) the dam DAMc, and may have a shape that is similar to or substantially similar to the shape of the first groove GR1*c* when viewed in a sectional view (e.g., in a cross-sectional view). In more detail, unlike the shape of the first groove GR1*c* when viewed in a sectional view (e.g., in a cross-sectional view), the organic encapsulation layer EN2*c* may be disposed on the first inorganic encapsulation layer EN1*c* that entirely covers the third groove GR3*c*. The third groove GR3*c* may serve to block moisture and impurities that have not been blocked by the first groove GR1*c* and the second groove GR2*c*.

According to an embodiment, a planarization layer OCc may be selectively further disposed at (e.g., in or on) the hole periphery region HPAc that is adjacent to the second hole region HA2*c*. The planarization layer OCc may include an organic insulating material, so that a top surface of the planarization layer OCc may be flat or substantially flat. The planarization layer OCc may compensate for a step formed by the organic encapsulation layer EN2*c* that is blocked by the dam DAMc. For example, a level of the top surface of the planarization layer OCc may be the same or substantially the same as a level of a top surface of the second inorganic encapsulation layer EN3*c*, so that the functional layer FLc may be disposed on a flat or substantially flat surface at (e.g., in or on) the hole periphery region HPAc. In this case, the planarization layer OCc may fill each of the first groove GR1*c* and the second groove GR2*c*.

An edge SUBc_E of the substrate SUBc may define a first through-hole formed through the substrate SUBc in the first hole region HA1*c*. In other words, the first hole region HA1*c* may be defined as a region overlapping with the first through-hole defined by the edge SUBc_E of the substrate SUBc. In this case, the edge SUBc_E of the substrate SUBc may surround (e.g., around a periphery of) the electronic device EE.

An edge BARc_E of the inorganic barrier layer BARc, an edge Glc_E of the gate insulating layer Glc, an edge VIA1c_E of the first via insulating layer VIA1*c*, an edge ML_E of the pattern layer ML, an edge VIA2c_E of the second via insulating layer VIA2*c*, an edge ELc_E of the organic light emitting layer ELc, an edge E2c_E of the common electrode layer E2*c*, an edge EN1c_E of the first inorganic encapsulation layer EN1*c*, an edge EN3c_E of the second inorganic encapsulation layer EN3*c*, an edge OCc_E of the planarization layer OCc, and an edge FLc_E of the functional layer FLc may define a second through-hole in the second hole region HA2*c*. In other words, the second hole region HA2*c* may be defined as a region overlapping with the second through-hole. In this case, the second through-hole may surround (e.g., around a periphery of) at least a portion of the electronic device EE.

The edge BARc_E of the inorganic barrier layer BARc, the edge Glc_E of the gate insulating layer Glc, the edge VIA1c_E of the first via insulating layer VIA1*c*, the edge ML_E of the pattern layer ML, the edge VIA2c_E of the second via insulating layer VIA2*c*, the edge ELc_E of the organic light emitting layer ELc, the edge E2c_E of the common electrode layer E2*c*, the edge EN1c_E of the first inorganic encapsulation layer EN1*c*, the edge EN3c_E of the second inorganic encapsulation layer EN3*c*, the edge OCc_E of the planarization layer OCc, and the edge FLc_E of the functional layer FLc, which define the second through-hole, may be aligned or substantially aligned with each other. In other words, side surfaces of the elements (e.g., the inorganic barrier layer BARc, the gate insulating layer Glc, the first via insulating layer VIA1*c*, the pattern layer ML, the second via insulating layer VIA2*c*, the organic light emitting layer ELc, the common electrode layer E2*c*, the first inorganic encapsulation layer EN1*c*, the second inorganic encapsulation layer EN3*c*, the planarization layer OCc, and the functional layer FLc) defining the second through-hole may be aligned or substantially aligned with each other, and may define a flat or substantially flat surface when viewed in a sectional view (e.g., in a cross-sectional view).

An area of the second through-hole defined in the second hole region HA2*c* may be greater than an area of the first through-hole defined in the first hole region HA1*c* when viewed in a plan view, and the second through-hole may surround (e.g., around a periphery of) the first through-hole when viewed in a plan view. In this case, a portion of the top surface of the substrate SUBc that is adjacent to the first hole region HA1*c* may be exposed through the second through-hole. According to one or more embodiments of the present disclosure, the second through-hole may surround (e.g., around a periphery of) the first through-hole, so that generation of cracks may be reduced at a periphery of the hole region HAc when the hole region HAc is formed. This will be described in more detail below with reference to FIGS. 26 through 30.

Figure 19:
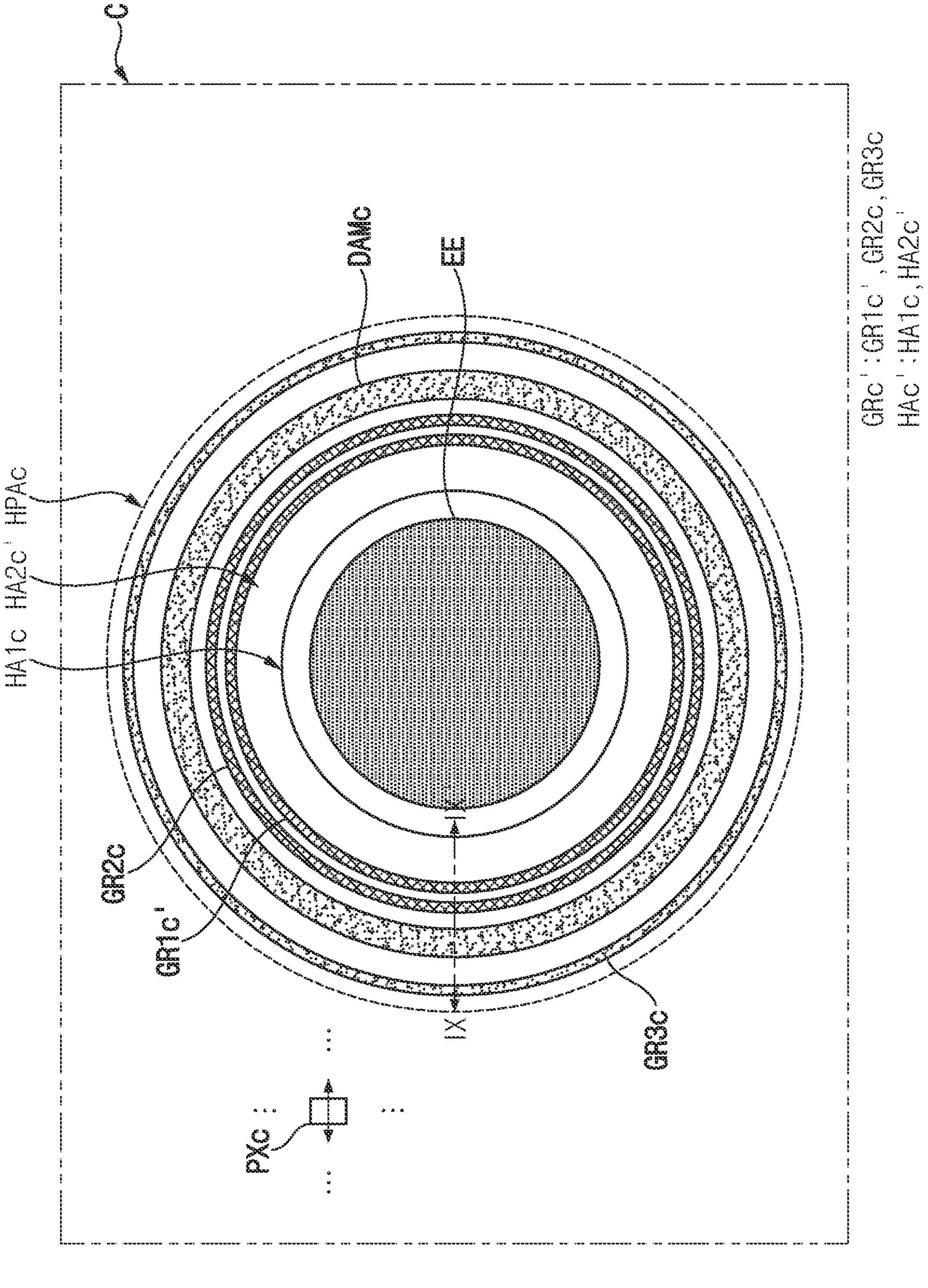
FIGS. 19 and 20 are views illustrating a hole region of the display device illustrated in FIG. 14, according to some embodiments.
Figure 20:
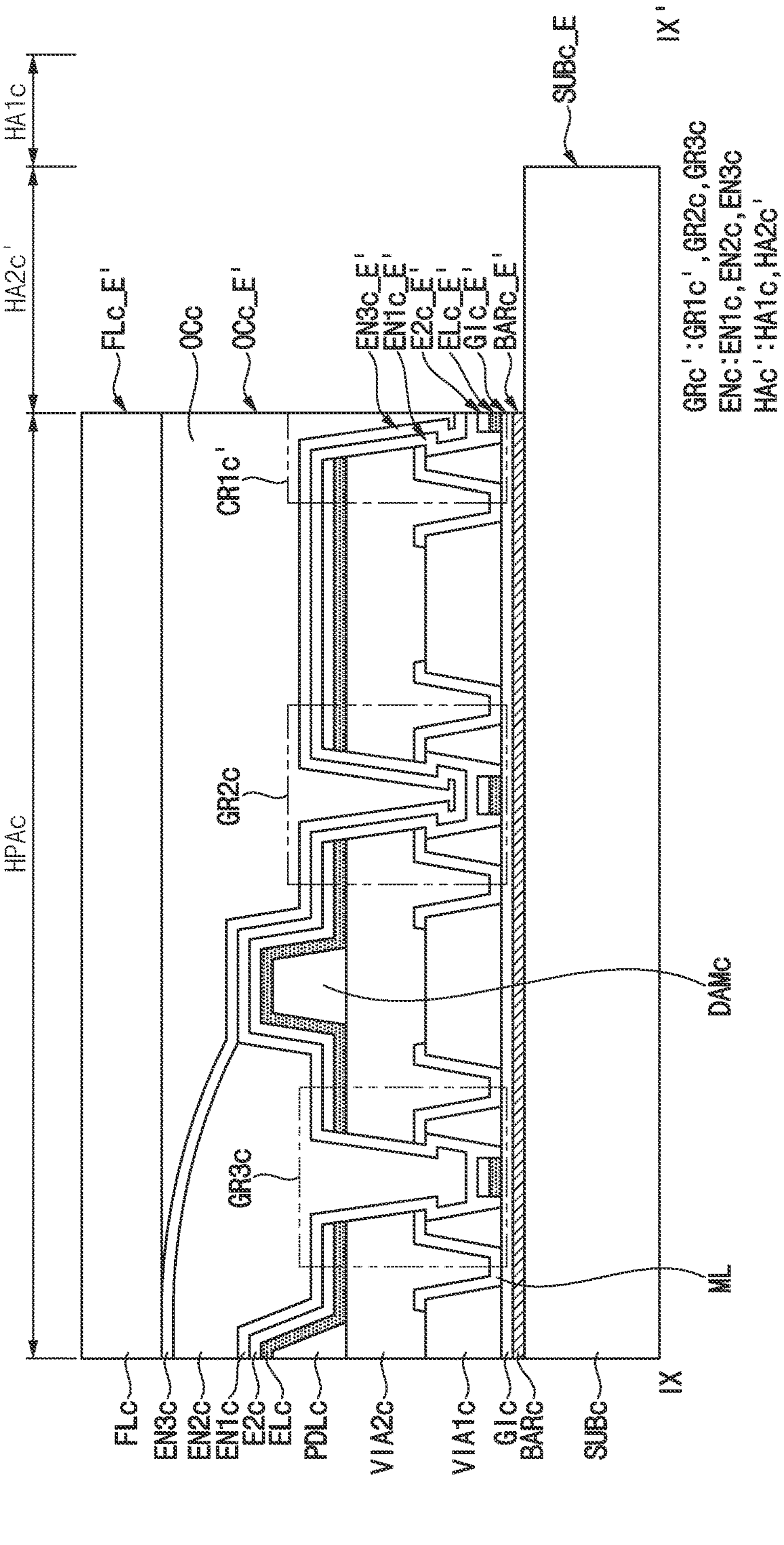

FIGS. 19 and 20 are views illustrating a hole region of the display device illustrated in FIG. 14, according to some embodiments. In the following description, redundant description of the elements and configurations that are the same or substantially the same as those described above with reference to FIGS. 15 through 18 may not be repeated.

Referring to FIGS. 19 and 20, a first groove GR1*c* may be formed by further removing a portion of the first groove GR1*c* described above with reference to FIGS. 15 and 17. As shown in FIG. 20, an inner edge of the first groove GR1*c* may be the same or substantially the same as an outer edge of the second hole region HA2C.

In this case, an edge BARc_E' of the inorganic barrier layer BARc, an edge Glc_E' of the gate insulating layer Glc, an edge ELc_E' of the organic light emitting layer ELc, an edge E2c_E' of the common electrode layer E2*c*, an edge EN1c_E of the first inorganic encapsulation layer EN1*c*, an edge EN3c_E' of the second inorganic encapsulation layer EN3*c*, an edge OCc_E' of the planarization layer OCc, and an edge FLc_E' of the functional layer FLc may define a second through-hole in the second hole region HA2*c* surrounding (e.g., around a periphery of) the first hole region HA1*c*. In other words, the second hole region HA2*c* may be defined as a region overlapping with the second through-hole. In this case, the second through-hole may surround (e.g., around a periphery of) at least a portion of the electronic device EE.

The edge BARc_E' of the inorganic barrier layer BARc, the edge Glc_E' of the gate insulating layer Glc, the edge ELc_E' of the organic light emitting layer ELc, the edge E2c_E' of the common electrode layer E2*c*, the edge EN1c_E of the first inorganic encapsulation layer EN1*c*, the edge EN3c_E' of the second inorganic encapsulation layer EN3*c*, the edge OCc_E' of the planarization layer OCc, and the edge FLc_E' of the functional layer FLc may be aligned or substantially aligned with each other. In other words, side surfaces of the elements (e.g., the inorganic barrier layer BARc, the gate insulating layer Glc, the organic light emitting layer ELc, the common electrode layer E2*c*, the first inorganic encapsulation layer EN1*c*, the second inorganic encapsulation layer EN3*c*, the planarization layer OCc, and the functional layer FLc) defining the second through-hole may be aligned or substantially aligned with each other, and may define a flat or substantially flat surface when viewed in a sectional view (e.g., in a cross-sectional view).

Even in this case, an area of the second through-hole defined in the second hole region HA2*c* may be greater than an area of the first through-hole defined in the first hole region HA1*c* when viewed in a plan view, and the second through-hole may surround (e.g., around a periphery of) the first through-hole when viewed in a plan view. In this case, a portion of the top surface of the substrate SUBc that is adjacent to the first hole region HA1*c* may be exposed through the second through-hole. Accordingly, generation of cracks may be reduced at a periphery of the hole region HAc when the hole region HAc is formed.

Figure 21:
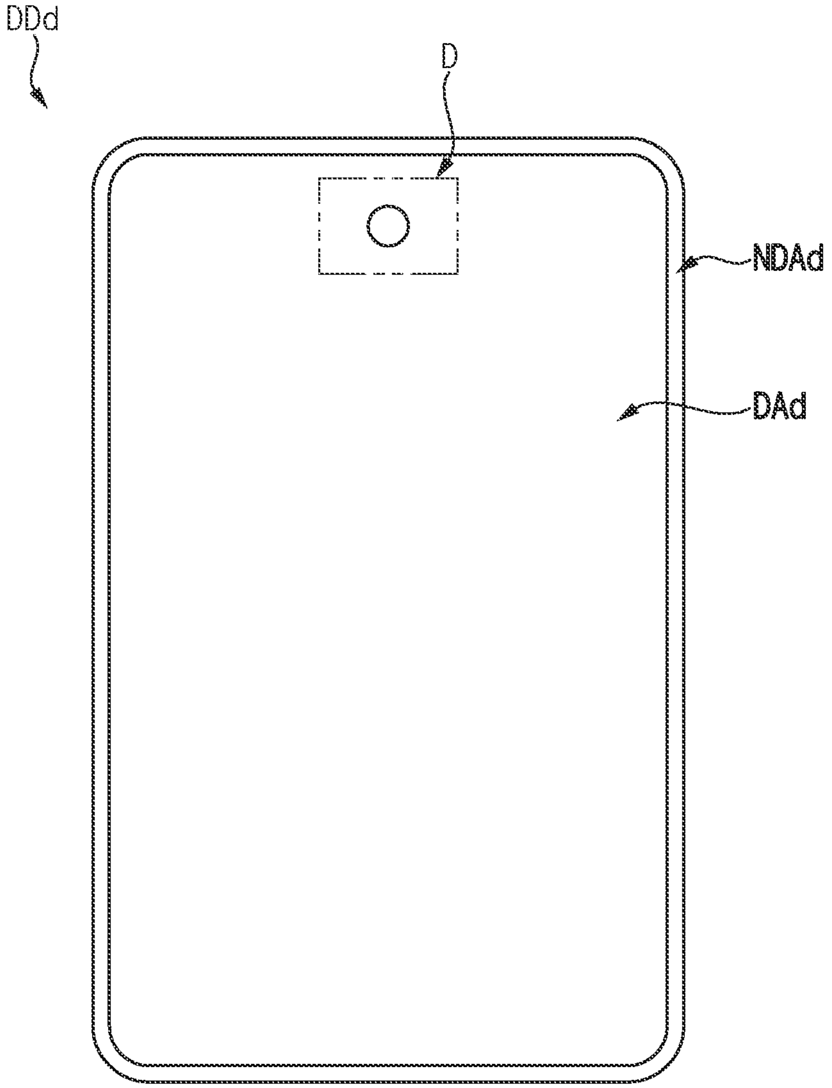
FIG. 21 is a plan view illustrating a display device according to an embodiment of the present disclosure.

FIG. 21 is a plan view illustrating a display device according to an embodiment of the present disclosure.

Referring to FIG. 21, a display device DDd may include a display region Dad, and a peripheral region NDAd surrounding (e.g., around a periphery of) the display region Dad.

The display region Dad may be the same or substantially the same as the display region DAa described above with reference to FIG. 1. For example, the display region DAd may be a region in which an image is displayed. The peripheral region NDAd may also be the same or substantially the same as the peripheral region NDAa described above with reference to FIG. 1.

A hole region, which is a region in which an image is not displayed, and in which an electronic device configured to detect light received from the outside is disposed, may be defined in at least a portion (e.g., a region D) of the display region DAd. For example, a camera may be disposed in the hole region. In this case, a user of the display device DDd may concurrently (e.g., simultaneously or substantially simultaneously) capture an image with the camera and view the image displayed in the display region DAd.

Figure 22:
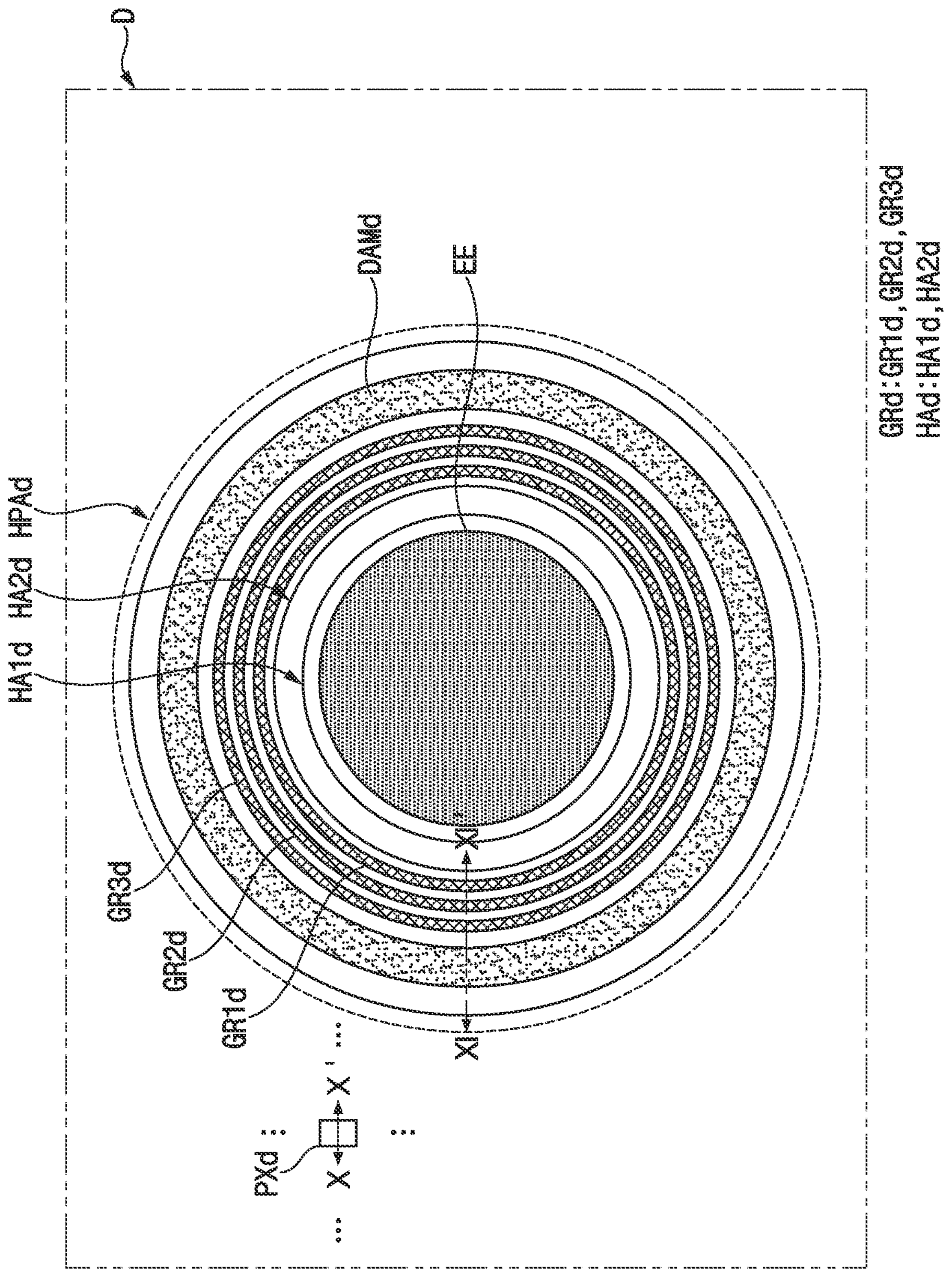
FIGS. 22-25 are views illustrating a hole region of the display device illustrated in FIG. 21, according to some embodiments.
Figure 23:
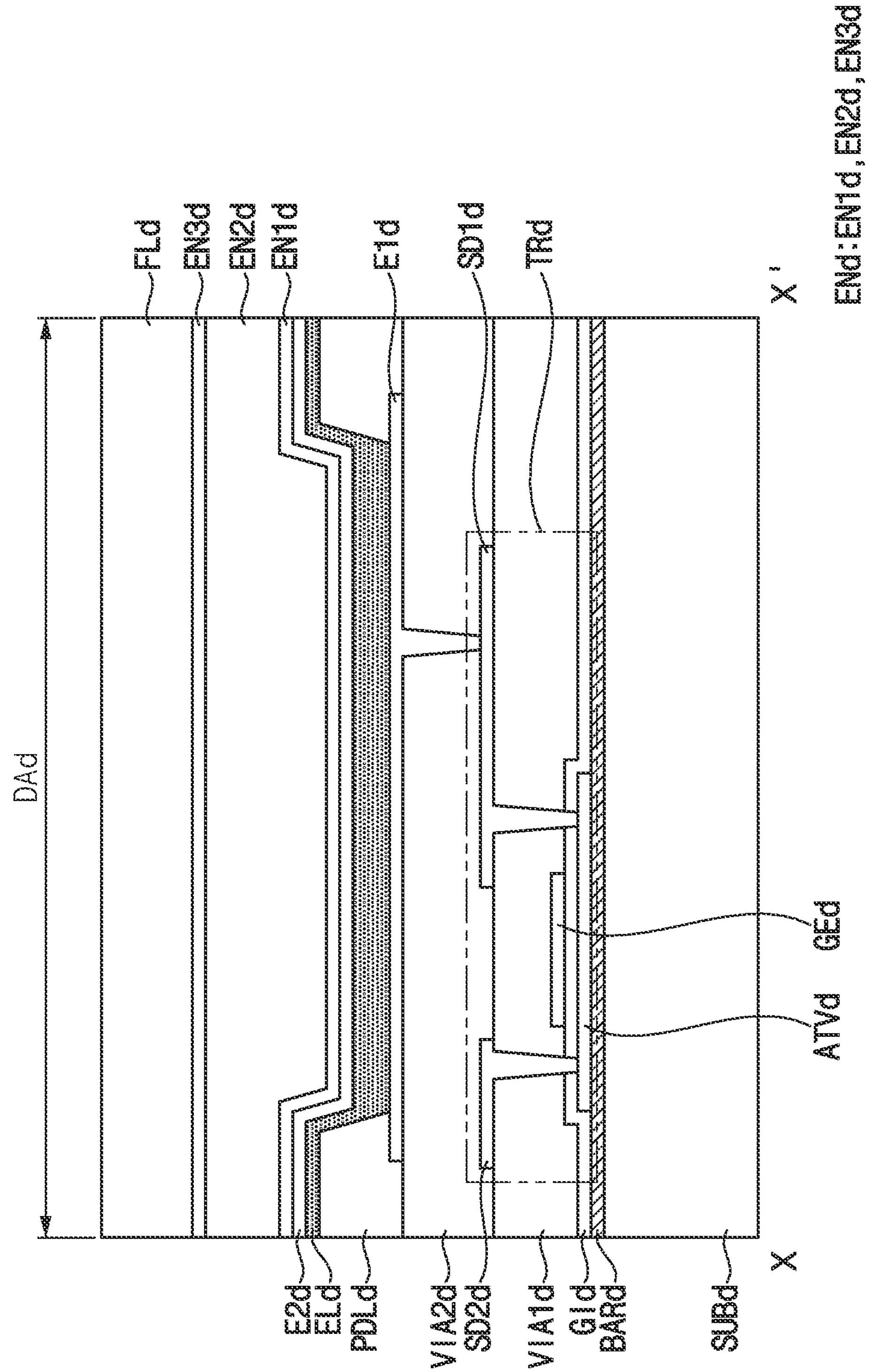
Figure 24:
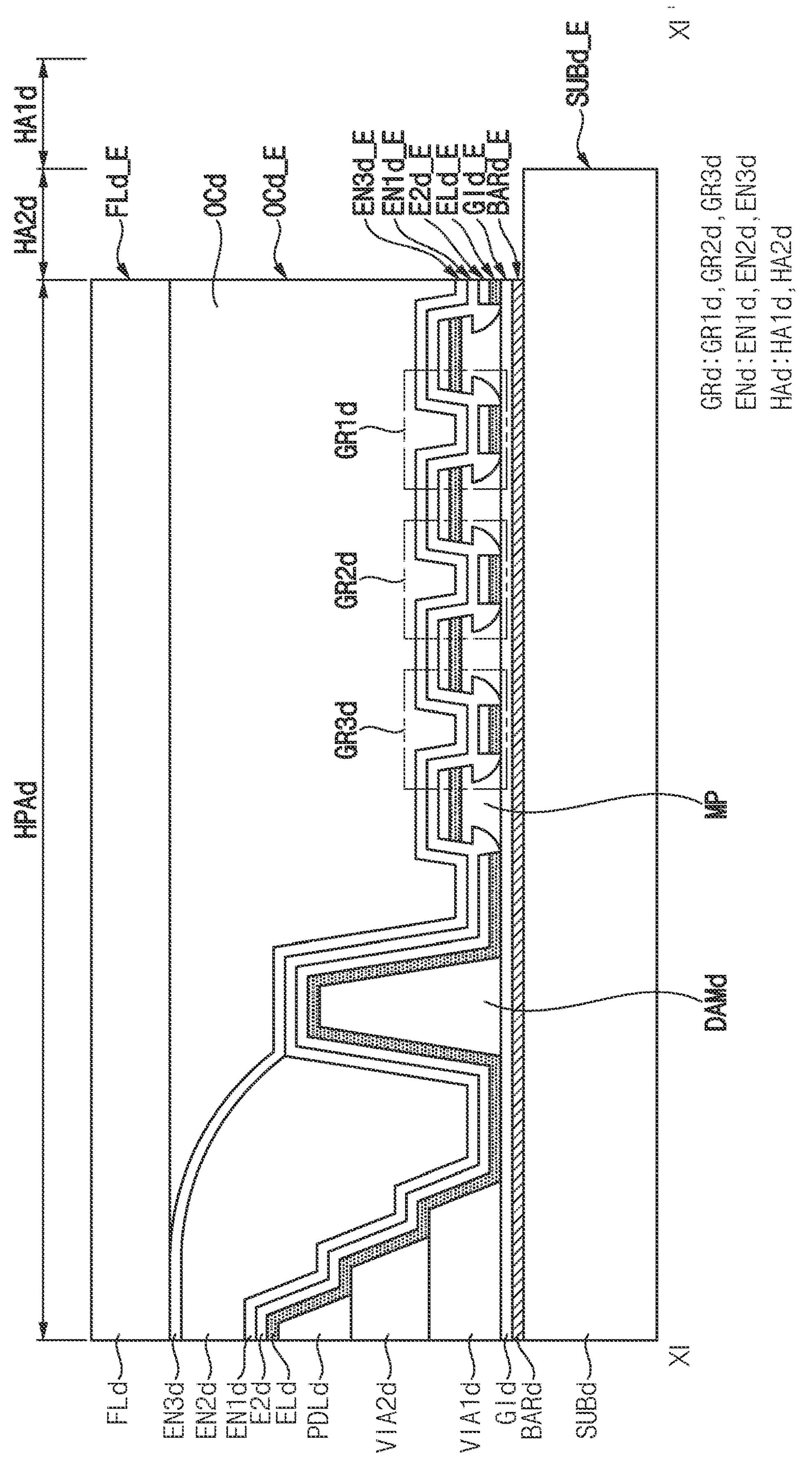

FIGS. 22 through 25 are views illustrating a hole region of the display device illustrated in FIG. 21, according to some embodiments. FIG. 22 is an enlarged plan view showing the region D of FIG. 21. FIG. 23 is a sectional view taken along the line X-X' of FIG. 22. FIG. 24 is a sectional view taken along the line XI-XI' of FIG. 22. FIG. is a sectional view illustrating a first groove of FIG. 24.

Referring to FIGS. 21 and 22, a hole region HAd may be defined in the portion (e.g., the region D) of the display region DAd. The hole region HAd may include a first hole region HA1*d*, and a second hole region HA2*d* surrounding (e.g., around a periphery of) the first hole region HA1*d*. In addition, a hole periphery region HPAd surrounding (e.g., around a periphery of) the second hole region HA2*d* may be defined between the display region DAd and the hole region HAd.

Each of the first hole region HA1*d* and the second hole region HA2*d* may be a region in which a through-hole formed through various elements included in the display device DDd is defined. An electronic device EE may be disposed inside the through-hole. According to one or more embodiments of the present disclosure, as shown in FIG. 22, when viewed in a plan view, the second hole region HA2*d* may surround (e.g., around a periphery of) the first hole region HA1*d*. In other words, an edge of the second hole region HA2*d* may be spaced apart from an edge of the first hole region HA1*d*, while surrounding (e.g., around a periphery of) the edge of the first hole region HA1*d*. The first hole region HA1*d* and the second hole region HA2*d* will be described in more below with reference to FIG. 24.

The hole periphery region HPAd may surround (e.g., around peripheries of) the first hole region HA1*d* and the second hole region HA2*d* when viewed in a plan view. At least one groove and at least one dam may be formed at (e.g., in or on) the hole periphery region HPAd. For example, a first groove GR1*d* surrounding (e.g., around a periphery of) the second hole region HA2*d*, a second groove GR2*d* surrounding (e.g., around a periphery of) the first groove GR1*d*, a third groove GR3*d* surrounding (e.g., around a periphery of) the second groove GR2*d*, and a dam DAMd surrounding (e.g., around a periphery of) the third groove GR3*d* may be formed at (e.g., in or on) the hole periphery region HPAd.

The first to third grooves GR1*d*, GR2*d*, and GR3*d* may serve to block moisture and foreign substances permeating into the display region DAd from the first hole region HA1*d* and the second hole region HA2*d*. In addition, the dam DAMd may serve to prevent or substantially prevent the organic encapsulation layer disposed at (e.g., in or on) the display region DAd from overflowing into the first hole region HA1*d* and the second hole region HA2*d*. The groove and the dam formed at (e.g., in or on) the hole periphery region HPAd will be described in more detail below with reference to FIG. 24.

A pixel PXd may be disposed at (e.g., in or on) the display region DAd outside the hole periphery region HPAd. The pixel PXd may emit light, and a plurality of pixels PXd may be provided at (e.g., in or on) the display region DAd. Accordingly, an image may be displayed in the display region DAd by combining the light emitted from the pixels PXd.

Hereinafter, the pixel PXd of the display device DDd will be described in more detail with reference to FIG. 23.

Referring to FIG. 23, the display device DDd may include a substrate SUBd, an inorganic barrier layer BARd, an active layer ATVd, a gate insulating layer Gld, a gate electrode GEd, a first via insulating layer VIA1*d*, a first source-drain electrode SD1*d*, a second source-drain electrode SD2*d*, a second via insulating layer VIA2*d*, a pixel electrode E1*d*, a pixel defining layer PDLd, an organic light emitting layer ELd, a common electrode layer E2*d*, an encapsulation layer ENd, and a functional layer FLd. These elements may define the pixel PXd disposed at (e.g., in or on) the display region DAd.

The substrate SUBd, the active layer ATVd, the gate insulating layer Gld, the gate electrode GED, the first via insulating layer VIA1*d*, the first source-drain electrode SD1*d*, the second source-drain electrode SD2*d*, the second via insulating layer VIA2*d*, the pixel electrode E1*d*, the pixel defining layer PDLd, the organic light emitting layer ELd, the common electrode layer E2*d*, the encapsulation layer ENd, and the functional layer FLd may be the same or substantially the same as the substrate SUBa, the active layer ATVa, the gate insulating layer Gla, the gate electrode GEa, the first via insulating layer VIA1*a*, the first source-drain electrode SD1*a*, the second source-drain electrode SD2*a*, the second via insulating layer VIA2*a*, the pixel electrode E1*a*, the pixel defining layer PDLa, the organic light emitting layer ELa, the common electrode layer E2*a*, the encapsulation layer ENa, and the functional layer FLa described above with reference to FIG. 3, and thus, redundant description thereof may not be repeated.

In addition, the inorganic barrier layer BARd may be the same or substantially the same as the first inorganic barrier layer BAR1*a* described above with reference to FIG. 3, and thus, redundant description thereof may not be repeated.

In other words, when compared with the display device DDa described above with reference to FIG. 3, the organic base layer BSLa and the second inorganic barrier layer BAR2*a* may be omitted in the display device DDd. Accordingly, the display device DDd may have a relatively thinner thickness as compared with that of the display device DDA.

Hereinafter, the first hole region HA1*d*, the second hole region HA2*d*, and the hole periphery region HPAd will be described in more detail with reference to FIGS. 24 and 25.

Figure 25:
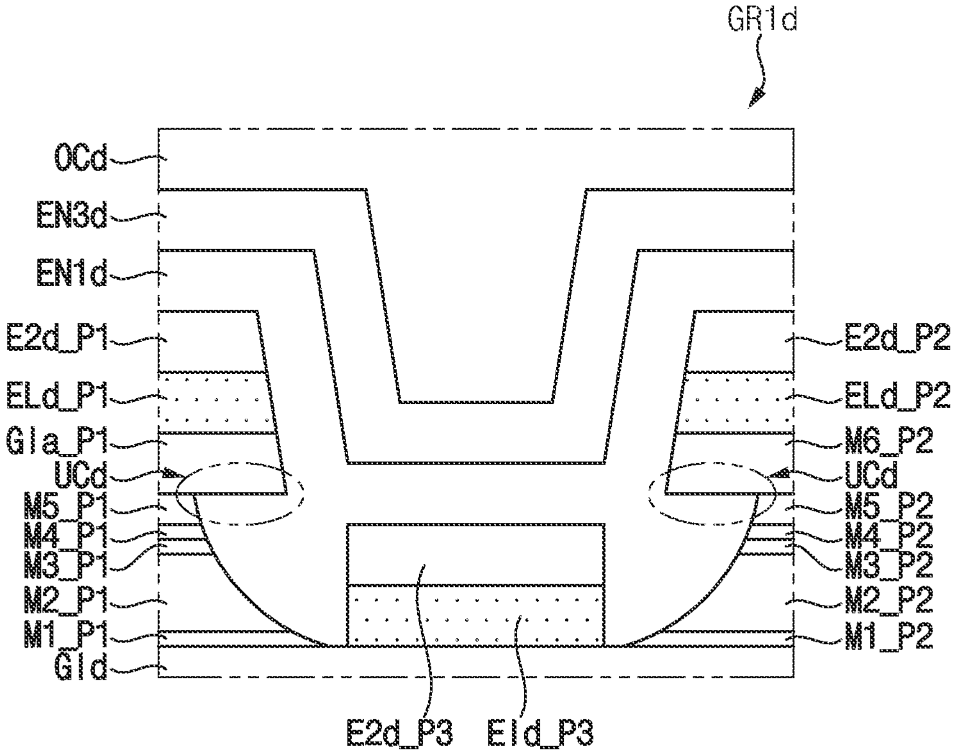

Referring to FIGS. 22, 24, and 25, the substrate SUBd, the inorganic barrier layer BARd, the gate insulating layer Gld, the first via insulating layer VIA1*d*, the second via insulating layer VIA2*d*, the pixel defining layer PDLd, the organic light emitting layer ELd, the common electrode layer E2*d*, the encapsulation layer ENd, and the functional layer FLd may extend from the display region DAd to at least the hole periphery region HPAd.

In addition, a metal pattern MP including the same material as a material included in at least one of the gate electrode GED, the first source-drain electrode SD1*d*, and/or the pixel electrode E1*d* may be disposed at (e.g., in or on) the hole periphery region HPAd. For example, the metal pattern MP may have a multilayered structure including a first layer including the same material as the material included in the gate electrode GED, and a second layer disposed on the first layer and including the same material as that of the first source-drain electrode SD1*d*.

The metal pattern MP may define a groove GRd in the hole periphery region HPAd. The groove GRd may include, for example, a first groove GR1*d*, a second groove GR2*d*, and a third groove GR3*d*. In addition, the dam DAMd surrounding (e.g., around a periphery of) the third groove GR3*d* may be disposed at (e.g., in or on) the hole periphery region HPAd.

The first groove GR1*d* may be defined by the metal pattern MP. In more detail, according to an embodiment, the metal pattern MP may include a first metal layer, a second metal layer, a third metal layer, a fourth metal layer, a fifth metal layer, and a sixth metal layer, which are sequentially stacked on the gate insulating layer Gld. In this case, the first to fifth metal layers may be referred to as a lower pattern part, and the sixth metal layer may be referred to as an upper pattern part.

The first to fifth metal layers may define a first opening exposing a portion of a top surface of the gate insulating layer Gld. For example, a first portion M1_P1 of the first metal layer, a first portion M2_P1 of the second metal layer, a first portion M3_P1 of the third metal layer, a first portion M4_P1 of the fourth metal layer, and a first portion M5_P1 of the fifth metal layer, which are disposed on the gate insulating layer Gld, may be spaced apart from a second portion M1_P2 of the first metal layer, a second portion M2_P2 of the second metal layer, a second portion M3_P2 of the third metal layer, a second portion M4_P2 of the fourth metal layer, and a second portion M5_P2 of the fifth metal layer, which are disposed on the gate insulating layer Gld, so that the first opening may be defined.

The sixth metal layer may define a second opening overlapping with the first opening. For example, a first portion M6_P1 of the sixth metal layer disposed on the first portion M5_P1 of the fifth metal layer may be spaced apart from a second portion M6_P2 of the sixth metal layer disposed on the second portion M5_P2 of the fifth metal layer, so that the second opening may be defined.

The first groove GR1*d* may be defined by the first opening and the second opening. In this case, a width of the second opening may be less than a width of the first opening in a region that is adjacent to the second opening when viewed in a sectional view (e.g., in a cross-sectional view). For example, a separation distance between the first portion M6_P1 of the sixth metal layer and the second portion M6_P2 of the sixth metal layer may be less than a separation distance between the first portion M5_P1 of the fifth metal layer and the second portion M5_P2 of the fifth metal layer. Accordingly, an undercut region UCd in which a bottom surface of the first portion M6_P1 of the sixth metal layer is exposed may be defined in a region that is adjacent to an interface between the first portion M6_P1 of the sixth metal layer and the first portion M5_P1 of the fifth metal layer. Similarly, an undercut region UCd in which a bottom surface of the second portion M6_P2 of the sixth metal layer is exposed may be defined in a region that is adjacent to an interface between the second portion M6_P2 of the sixth metal layer and the second portion M5_P2 of the fifth metal layer.

In this case, each of the organic light emitting layer ELd and the common electrode layer E2*d* disposed on the metal pattern MP may be disconnected along a region in which the first groove GR1*d* is defined by a step between the sixth metal layer and the fifth metal layer in the undercut region UCd.

In more detail, a first portion ELd_P1 of the organic light emitting layer ELd and a first portion E2d_P1 of the common electrode layer E2*d* may be sequentially stacked on the first portion M6_P1 of the sixth metal layer. A second portion ELd_P2 of the organic light emitting layer ELd and a second portion E2d_P2 of the common electrode layer E2*d* may be sequentially stacked on the second portion M6_P2 of the sixth metal layer. In addition, a third portion ELd_P3 of the organic light emitting layer ELd and a third portion E2d_P3 of the common electrode layer E2*d* may be sequentially stacked on the gate insulating layer Gld within the first groove GR1*d*.

Each of the third portion ELd_P3 of the organic light emitting layer ELd and the third portion E2d_P3 of the common electrode layer E2*d* may be spaced apart from the first portion ELd_P1 of the organic light emitting layer ELd, the first portion E2d_P1 of the common electrode layer E2*d*, the second portion ELd_P2 of the organic light emitting layer ELd, and the second portion E2d_P2 of the common electrode layer E2*d*. Accordingly, each of the organic light emitting layer ELd and the common electrode layer E2*d* may be disconnected in the region in which the first groove GR1*d* is defined.

The first inorganic encapsulation layer EN1*d* may entirely cover the first groove GR1*d* along a profile of the elements constituting the first groove GR1*d* (e.g., may be disposed in the first groove GR1*d*) when viewed in a sectional view (e.g., in a cross-sectional view). In addition, the second inorganic encapsulation layer EN3*d* may cover the first inorganic encapsulation layer EN1*d*.

The first groove GR1*d* may serve to block moisture and impurities introduced from the second hole region HA2*d*. In more detail, moisture and impurities introduced from the second hole region HA2*d* may permeate into the display region Dad, so as to cause defects in the pixel PXd. The moisture and the impurities may permeate along an organic layer (e.g., the organic light emitting layer ELd), or along a conductive layer (e.g., the common electrode layer E2*d*). According to one or more embodiments of the present disclosure, in the region in which the first groove GR1*d* surrounding (e.g., around a periphery of) the second hole region HA2*d* is defined, each of the organic light emitting layer ELd and the common electrode layer E2*d* may be disconnected, and the first inorganic encapsulation layer EN1*d* may entirely cover the first groove GR1*d*. Accordingly, a permeation path of the moisture and the impurities may be blocked by the first groove GR1*d*.

The second groove GR2*d* may surround (e.g., around a periphery of) the first groove GR1*d*, and may have the same or substantially the same shape as that of the first groove GR1*d* when viewed in a sectional view (e.g., in a cross-sectional view). Accordingly, the second groove GR2*d* may serve to block moisture and impurities that have not been blocked by the first groove GR1*d*.

The third groove GR3*d* may surround (e.g., around a periphery of) the second groove GR2*d*, and may have the same or substantially the same shape as that of the first groove GR1*d* when viewed in a sectional view (e.g., in a cross-sectional view). Accordingly, the third groove GR3*d* may serve to block moisture and impurities that have not been blocked by the first groove GR1*d* and the second groove GR2*d*.

The dam DAMd may serve to prevent or substantially prevent the organic encapsulation layer EN2*d* from overflowing in a direction toward the second hole region HA2*d* and the first hole region HA1*d*. As such, the dam DAMd may protrude from the gate insulating layer Gld to have a suitable height (e.g., a predetermined height). Accordingly, the organic encapsulation layer EN2*d* may not exist or substantially exist within a region surrounded (e.g., around a periphery thereof) by the dam DAMd. In this case, the first inorganic encapsulation layer EN1*d* and the second inorganic encapsulation layer EN3*d* may contact each other within the region surrounded (e.g., around a periphery thereof) by the dam DAMd.

The dam DAMd may include the same material as that of at least one of the first via insulating layer VIAld, the second via insulating layer VIA2*d*, and/or the pixel defining layer PDLd. For example, the dam DAMd may have a multilayered structure in which two layers are stacked. In this case, a first layer of the dam DAMd may include the same material as that of the first via insulating layer VIAld, and a second layer of the dam DAMd may include the same material as that of the second via insulating layer VIA2*d*. However, the structure of the dam DAMd is not limited to those described above, and the dam DAMd may have various suitable structures for preventing or substantially preventing the organic encapsulation layer EN2*d* from overflowing.

Each of the first via insulating layer VIA1*d*, the second via insulating layer VIA2*d*, and the pixel defining layer PDLd extending from the display region DAd to the hole periphery region HPAd may be disposed outside the region surrounded (e.g., around a periphery thereof) by the dam DAMd. In this case, each of the first via insulating layer VIAld, the second via insulating layer VIA2*d*, and the pixel defining layer PDLd may be spaced apart from the dam DAMd.

According to an embodiment, a planarization layer OCd may be selectively further disposed at (e.g., in or on) the hole periphery region HPAd that is adjacent to the second hole region HA2*d*. The planarization layer OCd may include an organic insulating material, so that a top surface of the planarization layer OCd may be flat or substantially flat. The planarization layer OCd may compensate for a step formed by the organic encapsulation layer EN2*d* that is blocked by the dam DAMd. For example, a level of the top surface of the planarization layer OCd may be the same or substantially the same as a level of a top surface of the second inorganic encapsulation layer EN3*d*, so that the functional layer FLd may be disposed on a flat or substantially flat surface at (e.g., in or on) the hole periphery region HPAd. In this case, the planarization layer OCd may fill each of the first groove GR1*d*, the second groove GR2*d*, and the third groove GR3*d*.

An edge SUBd_E of the substrate SUBd may define a first through-hole formed through the substrate SUBd in the first hole region HA1*d*. In other words, the first hole region HA1*d* may be defined as a region overlapping with the first through-hole defined by the edge SUBd_E of the substrate SUBd. In this case, the edge SUBd_E of the substrate SUBd may surround (e.g., around a periphery of) the electronic device EE.

An edge BARd_E of the inorganic barrier layer BARd, an edge Gld_E of the gate insulating layer Gld, an edge ELd_E of the organic light emitting layer ELd, an edge E2d_E of the common electrode layer E2*d*, an edge EN1d_E of the first inorganic encapsulation layer EN1*d*, an edge EN3d_E of the second inorganic encapsulation layer EN3*d*, an edge OCd_E of the planarization layer OCd, and an edge FLd_E of the functional layer FLd may define a second through-hole in the second hole region HA2*d*. In other words, the second hole region HA2*d* may be defined as a region overlapping with the second through-hole. In this case, the second through-hole may surround (e.g., around a periphery of) at least a portion of the electronic device EE.

The edge BARd_E of the inorganic barrier layer BARd, the edge Gld_E of the gate insulating layer Gld, the edge ELd_E of the organic light emitting layer ELd, the edge E2d_E of the common electrode layer E2*d*, the edge EN1d_E of the first inorganic encapsulation layer EN1*d*, the edge EN3d_E of the second inorganic encapsulation layer EN3*d*, the edge OCd_E of the planarization layer OCd, and the edge FLd_E of the functional layer FLd, which define the second through-hole, may be aligned or substantially aligned with each other. In other words, side surfaces of the elements (e.g., the inorganic barrier layer BARd, the gate insulating layer Gld, the organic light emitting layer ELd, the common electrode layer E2*d*, the first inorganic encapsulation layer EN1*d*, the second inorganic encapsulation layer EN3*d*, the planarization layer OCd, and the functional layer FLd) defining the second through-hole may be aligned or substantially aligned with each other, and may define a flat or substantially flat surface when viewed in a sectional view (e.g., in a cross-sectional view).

An area of the second through-hole defined in the second hole region HA2*d* may be greater than an area of the first through-hole defined in the first hole region HA1*d* when viewed in a plan view, and the second through-hole may surround (e.g., around a periphery of) the first through-hole when viewed in a plan view. In this case, a portion of the top surface of the substrate SUBd that is adjacent to the first hole region HA1*d* may be exposed through the second through-hole. According to one or more embodiments of the present disclosure, the second through-hole may surround (e.g., around a periphery of) the first through-hole, so that generation of cracks may be reduced at a periphery of the hole region HAd when the hole region HAd is formed. This will be described in more detail below with reference to FIGS. 26 through 30.

FIGS. 26 through 30 are views illustrating a method for manufacturing a display device according to one or more embodiments of the present disclosure.

Figure 26:
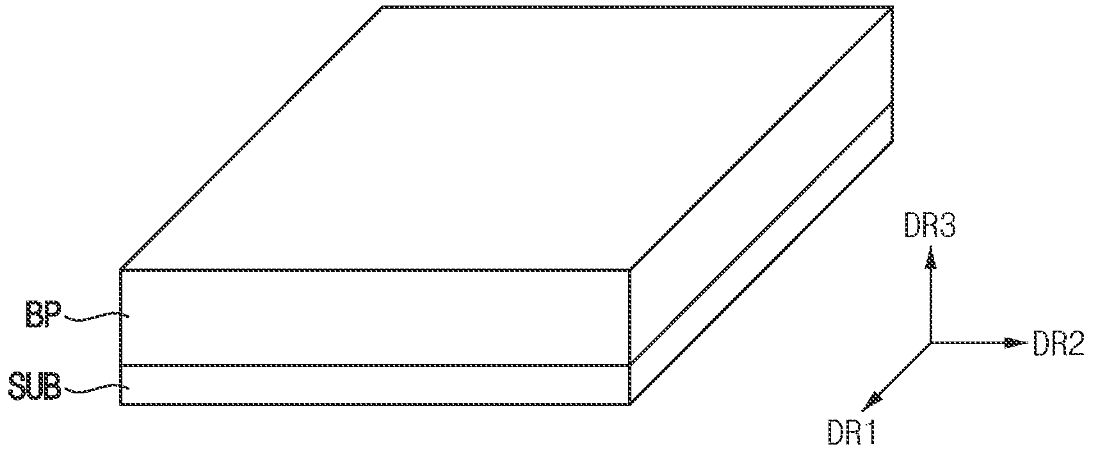
FIGS. 26-30 are views illustrating a method for manufacturing a display device according to one or more embodiments of the present disclosure.

Referring to FIG. 26, a panel layer BP may be formed on a substrate SUB. The substrate SUB may be any one of the substrates SUBa, SUBb, SUBc, or SUBd described above.

For example, when the substrate SUB is the substrate SUBa included in the display device DDa described above, the panel layer BP may include the elements described above with reference to FIGS. 3 and 4.

When the substrate SUB is the substrate SUBb included in the display device DDb described above, the panel layer BP may include the elements described above with reference to FIGS. 10 and 11.

When the substrate SUB is the substrate SUBc included in the display device DDc described above, the panel layer BP may include the elements described above with reference to FIGS. 16 and 17.

When the substrate SUB is the substrate SUBd included in the display device DDd described above, the panel layer BP may include the elements described above with reference to FIGS. 23 and 24.

Figure 27:
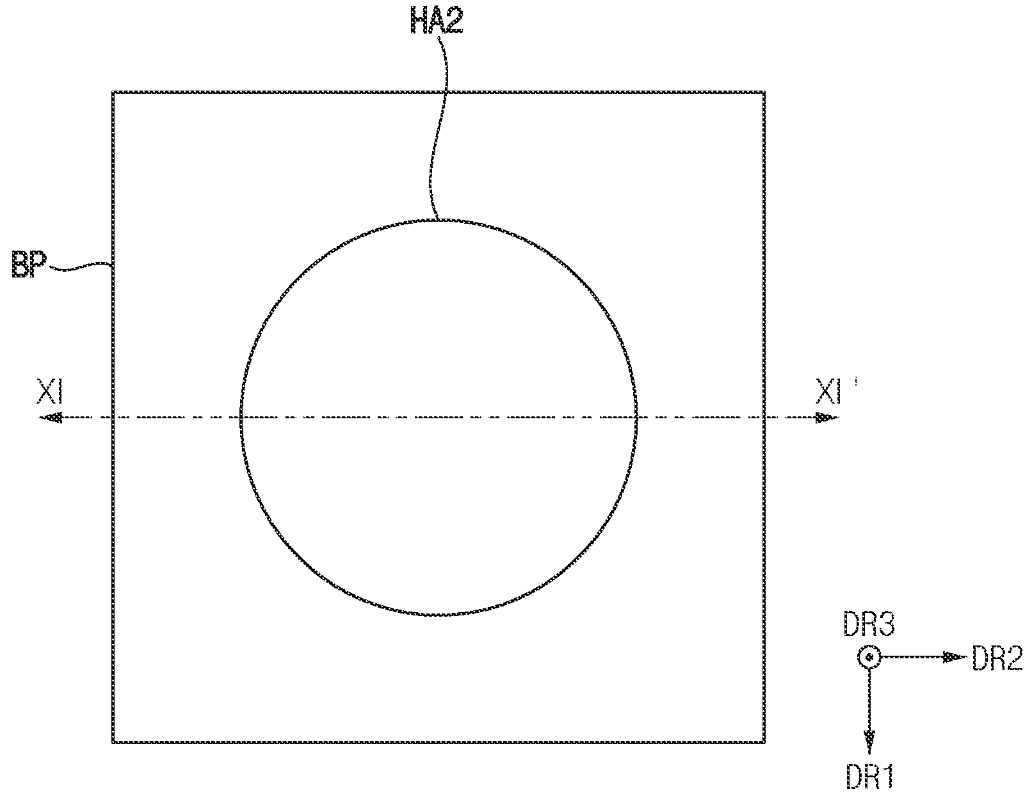
Figure 28:
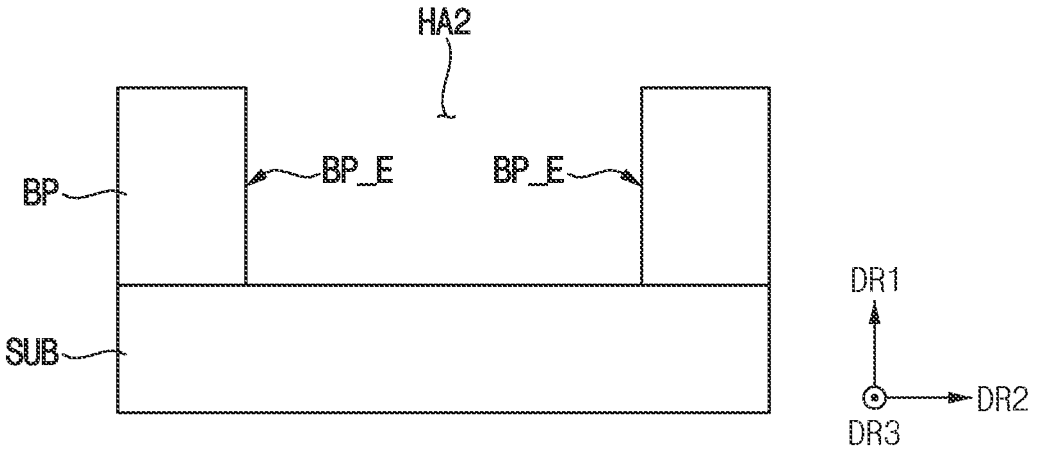

Referring to FIGS. 27 and 28, a second through-hole may be formed by removing a portion of the panel layer BP (e.g., along a cut part), so that a second hole region HA2 defined as a region overlapping with the second through-hole may be formed. In this case, an edge BP_E of the panel layer BP defined as a portion of the panel layer BP that is removed may have a flat or substantially flat surface when viewed in a sectional view (e.g., in a cross-sectional view).

A method for removing the portion of the panel layer BP is not particularly limited, and various suitable known methods for removing the portion of the panel layer BP (e.g., such as by emitting a laser) may be used.

Figure 29:
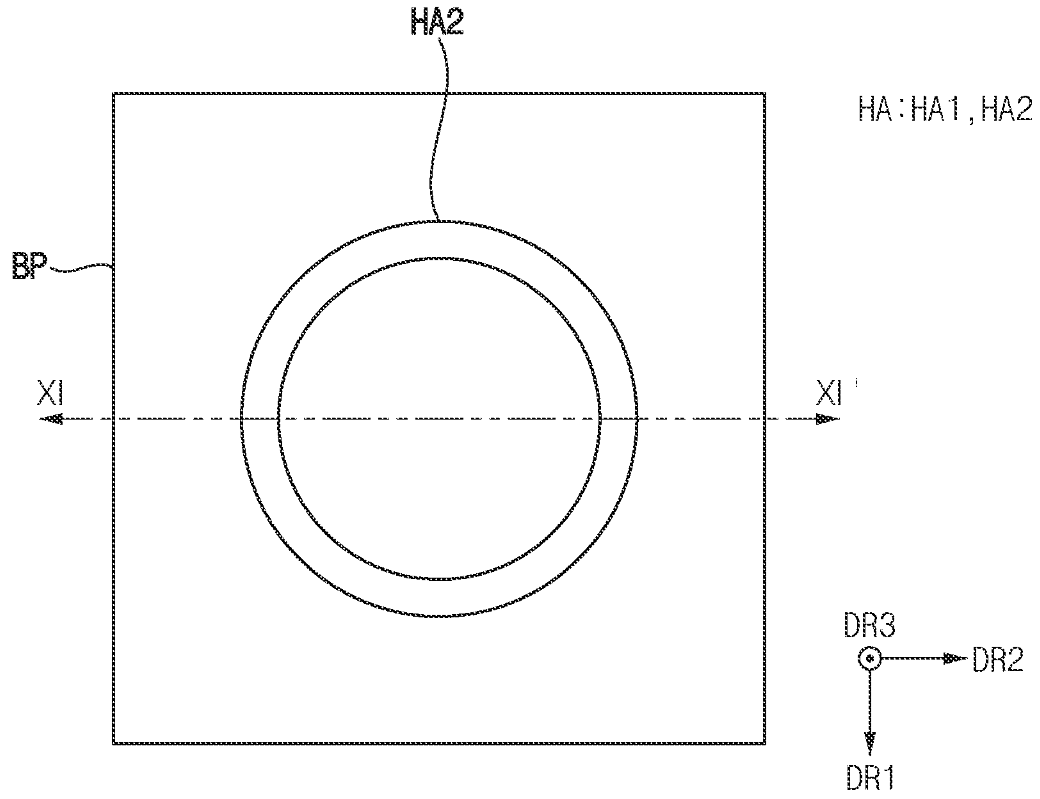
Figure 30:
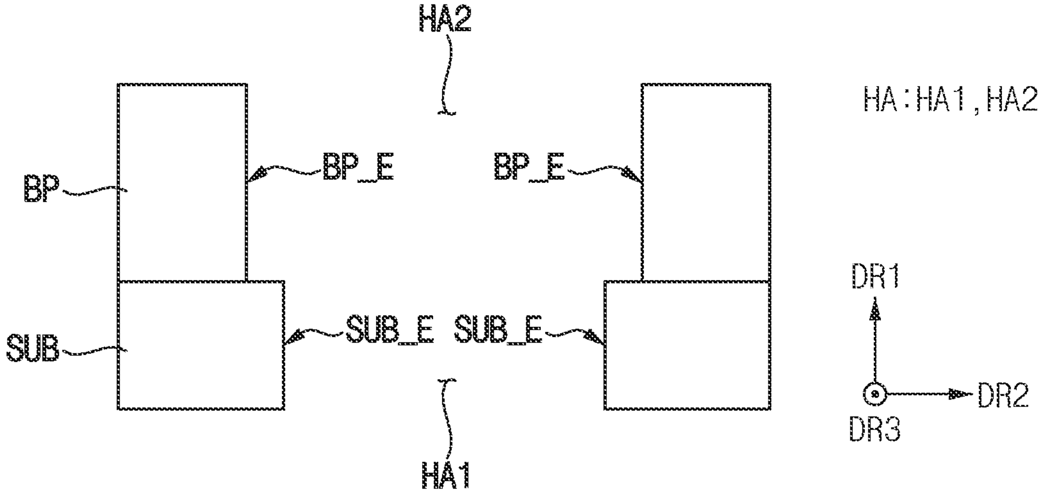

Referring to FIGS. 29 and 30, after the portion of the panel layer BP is removed, a first through-hole may be formed by removing a portion of the substrate SUB, so that a first hole region HA1 defined as a region overlapping with the first through-hole may be formed. A method for removing the portion of the substrate SUB is not particularly limited, and various suitable known methods may be used.

As described above, after the portion of the panel layer BP is first removed, the portion of the substrate SUB may be removed, so that the removal of the portion of the panel layer BP and the portion of the substrate SUB may be facilitated as compared with a process of concurrently (e.g., simultaneously or substantially simultaneously) removing the portion of the panel layer BP and the portion of the substrate SUB.

For example, when the panel layer BP and the substrate SUB are concurrently (e.g., simultaneously or substantially simultaneously) cut and removed, the panel layer BP may not be completely cut during a cutting process. In this case, when the portion of the panel layer BP and the portion of the substrate SUB are concurrently (e.g., simultaneously or substantially simultaneously) removed, the panel layer BP may be torn off, so that cracks may be generated in the panel layer BP. According to one or more embodiments of the present disclosure, the portion of the substrate SUB may be removed after the portion of the panel layer BP is removed, so that cracks may not be generated in the panel layer BP.

An area of the first hole region HA1 may be less than an area of the second hole region HA2 when viewed in a plan view, and the second hole region HA2 may surround (e.g., around a periphery of) the first hole region HA1. In other words, a portion of a top surface of the substrate SUB that is adjacent to the first hole region HA1 may be exposed through the second through-hole defined in the second hole region HA2. Accordingly, the edge BP_E of the panel layer BP that is adjacent to an edge SUB_E of the substrate SUB may be prevented or substantially prevented from being damaged in a process of removing the portion of the substrate SUB.

For example, when a process of polishing the portion of the substrate SUB is performed to remove the portion of the substrate SUB, because the area of the second hole region HA2 is greater than the area of the first hole region HA1 when viewed in a plan view, a sufficient margin may be ensured between a polishing device used in the polishing process and the edge BP_E of the panel layer BP. Accordingly, the polishing device used in the polishing process may not contact (e.g., may not make contact with) the edge BP_E of the panel layer BP, so that the panel layer BP may not be damaged.

As another example, when a process of emitting a laser along an edge of the portion of the substrate SUB is performed to remove the portion of the substrate SUB, because the area of the second hole region HA2 is greater than the area of the first hole region HA1 when viewed in a plan view, a sufficient margin may be ensured between a traveling path of the laser and the edge BP_E of the panel layer BP. The laser may not be emitted to the panel layer BP, so that the panel layer BP may not be damaged.

In addition, according to one or more embodiments of the present disclosure, various grooves GRa, GRb, GRc, and GRd surrounding (e.g., around a periphery of) the second hole region HA2 may be provided in the display devices DDa, DDb, DDc, and DDd. Accordingly, until the portion of the substrate SUB is removed after the portion of the panel layer BP is removed, the display devices DDa, DDb, DDc, and DDd may be prevented or substantially prevented from being damaged by moisture and foreign substances permeating through the edge BP_E of the panel layer BP.

A display device according to various embodiments of the present disclosure may be applied to a display device included in a computer, a smart phone, a smart pad, and the like.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:

a substrate defining a first through-hole of a first hole region; and a panel layer on the substrate, and defining a second through-hole that surrounds and is outside the first hole region in a plan view, the panel layer comprising:

a base layer defining a groove surrounding a second hole region in a plan view, the second hole region overlapping with the second through-hole;

an organic light emitting layer comprising a cut part overlapping with the groove, and having an edge defining a portion of the second through-hole; and an inorganic encapsulation layer on the organic light emitting layer, and covering the groove, the inorganic encapsulation layer having an edge defining a portion of the second through-hole, wherein the edge of the organic light emitting layer and the edge of the inorganic encapsulation layer are aligned with each other perpendicularly to a top surface of the substrate.

2. The display device of claim 1, wherein the base layer comprises:

a first inorganic barrier layer on the substrate;

an organic base layer on the first inorganic barrier layer, and defining a first opening of a portion of the groove that exposes a portion of a top surface of the first inorganic barrier layer; and a second inorganic barrier layer on the organic base layer, and defining a second opening overlapping with the first opening to define a portion of the groove.

3. The display device of claim 2, wherein a width of the second opening is less than a width of the first opening in a region adjacent to the second opening in a cross-sectional view.

4. A display device comprising:

a substrate defining a first through-hole of a first hole region; and a panel layer on the substrate, and defining a second through-hole that surrounds and is outside the first hole region in a plan view, the panel layer comprising:

a base layer defining a groove surrounding a second hole region in a plan view, the second hole region overlapping with the second through-hole;

an organic light emitting layer comprising a cut part overlapping with the groove, and having an edge defining a portion of the second through-hole; and an inorganic encapsulation layer on the organic light emitting layer, and covering the groove, the inorganic encapsulation layer having an edge defining a portion of the second through-hole, wherein the base layer comprises:

a first inorganic barrier layer on the substrate;

an organic base layer on the first inorganic barrier layer, and defining a first opening of a portion of the groove that exposes a portion of a top surface of the first inorganic barrier layer; and a second inorganic barrier layer on the organic base layer, and defining a second opening overlapping with the first opening to define a portion of the groove, and wherein an edge of the first inorganic barrier layer defines a portion of the second through-hole, and is aligned with the edge of the inorganic encapsulation layer.

5. The display device of claim 4, wherein each of an edge of the organic base layer and an edge of the second inorganic barrier layer defines a portion of the second through-hole, and wherein the edge of the first inorganic barrier layer, the edge of the organic base layer, and the edge of the second inorganic barrier layer are aligned with each other.

6. The display device of claim 1, wherein the panel layer further comprises a common electrode layer between the inorganic encapsulation layer and the organic light emitting layer, the common electrode layer having an edge defining a portion of the second through-hole.

7. The display device of claim 6, wherein the edge of the organic light emitting layer and the edge of the common electrode layer are aligned with each other.

8. The display device of claim 6, wherein the common electrode layer comprises a cut part overlapping with the groove.

9. The display device of claim 1, wherein the second through-hole exposes a portion of a top surface of the substrate that is adjacent to the first hole region.

10. The display device of claim 1, wherein the panel layer further comprises a planarization layer on at least a portion of the inorganic encapsulation layer, and having an edge defining a portion of the second through-hole.

11. The display device of claim 10, wherein the edge of the planarization layer and the edge of the organic light emitting layer are aligned with each other.

* * * * *